US012598816B2

(12) United States Patent (10) Patent No.: US 12,598,816 B2
Watakabe et al. (45) Date of Patent: Apr. 7, 2026

(54) METHOD FOR MANUFACTURING SEMICONDUCTOR DEVICE

(71) Applicant: Japan Display Inc., Tokyo (JP)

(72) Inventors: Hajime Watakabe, Tokyo (JP); Masashi Tsubuku, Tokyo (JP); Toshinari Sasaki, Tokyo (JP); Takaya Tamaru, Tokyo (JP)

(73) Assignee: Japan Display Inc., Tokyo (JP)

( * ) Notice: Subject to any disclaimer, the term of this patent is extended or adjusted under 35 U.S.C. 154(b) by 348 days.

(21) Appl. No.: 18/127,679

(22) Filed: Mar. 29, 2023

(65) Prior Publication Data

US 2023/0317834 A1 Oct. 5, 2023

(30) Foreign Application Priority Data

Mar. 30, 2022 (JP) ................................. 2022-057454

(51) Int. Cl.
H01L 21/02 (2006.01)
H01L 21/385 (2006.01)
(Continued)

(52) U.S. Cl.
CPC ........... H10D 99/00 (2025.01); H01L 21/385 (2013.01); H10D 30/6755 (2025.01);
(Continued)

(58) Field of Classification Search
CPC ............. H10D 30/615; H10D 30/6739; H10D 30/6755; H10D 30/6757; H10D 99/00;
(Continued)

(56) References Cited

U.S. PATENT DOCUMENTS 11,581,427 B2 * 2/2023 Koezuka ........... H01L 21/47576
2012/0064664 A1 3/2012 Yamazaki et al.
(Continued)

FOREIGN PATENT DOCUMENTS

JP 2012-74622 A 4/2012
JP 2014-099601 A 5/2014
(Continued)

OTHER PUBLICATIONS

Office Action issued Aug. 12, 2024, in corresponding Indian Patent Application No. 202314023323, 5pp.
(Continued)

*Primary Examiner* — Monica D Harrison
(74) *Attorney, Agent, or Firm* — XSENSUS LLP

(57) ABSTRACT

A method for manufacturing semiconductor device according to an embodiment includes: forming a first metal oxide layer containing aluminum as a main component above a substrate; forming an oxide semiconductor layer above the first metal oxide layer; forming a gate insulating layer above the oxide semiconductor layer; forming a second metal oxide layer containing aluminum as a main component above the gate insulating layer; performing a heat treatment in a state where the second metal oxide layer is formed above the gate insulating layer; removing the second metal oxide layer after the heat treatment; and forming a gate electrode above the gate insulating layer.

19 Claims, 33 Drawing Sheets

10

(51) Int. Cl.

| | | |
|---|---|---|
| *H10D 30/67* | (2025.01) |
| *H10D 99/00* | (2025.01) |
| *G02F 1/1368* | (2006.01) |
| *H10D 30/60* | (2025.01) |
| *H10K 59/122* | (2023.01) |

(52) U.S. Cl.
CPC ..... *H10D 30/6757* (2025.01); *G02F 1/13685* (2021.01); *H01L 21/02565* (2013.01); *H01L 21/02631* (2013.01); *H01L 21/02667* (2013.01); *H10D 30/615* (2025.01); *H10D 30/6739* (2025.01); *H10K 59/122* (2023.02)

(58) Field of Classification Search
CPC .. H10D 30/6734; H10D 86/423; H10D 86/60; H10D 30/6704; H10K 59/122; H10K 59/1213; H01L 21/02565; H01L 21/02631; H01L 21/02667; H01L 21/385; H01L 21/28017; G02F 1/13685
USPC ......................................................... 438/104
See application file for complete search history.

(56) References Cited

U.S. PATENT DOCUMENTS

| | | | |
|---|---|---|---|
| 2014/0034946 A1 | 2/2014 | Yamazaki et al. |
| 2014/0077205 A1 | 3/2014 | Yamazaki et al. |
| 2014/0113405 A1 | 4/2014 | Tsubuku et al. |
| 2014/0306221 A1 | 10/2014 | Yamazaki et al. |
| 2015/0014679 A1 | 1/2015 | Sasagawa et al. |
| 2015/0084043 A1 | 3/2015 | Ishihara et al. |
| 2015/0372023 A1 | 12/2015 | Jintyou et al. |
| 2016/0190329 A1 | 6/2016 | Matsumoto et al. |
| 2017/0236844 A1 | 8/2017 | Yamazaki et al. |
| 2020/0052100 A1 | 2/2020 | Koezuka et al. |
| 2020/0328282 A1 | 10/2020 | Yamazaki et al. |
| 2021/0265353 A1 | 8/2021 | Okamoto et al. |

FOREIGN PATENT DOCUMENTS

| | | |
|---|---|---|
| JP | 2016-184771 A | 10/2016 |
| JP | 2017005277 A | 1/2017 |
| JP | 2018-006730 A | 1/2018 |
| JP | 2020027942 A | 2/2020 |
| JP | 2021-108405 A | 7/2021 |
| JP | 2021-141338 A | 9/2021 |
| JP | 2021-153196 A | 9/2021 |
| KR | 20200018281 A | 2/2020 |
| KR | 20220019733 A | 2/2022 |
| WO | 2019087002 A1 | 5/2019 |
| WO | 2020008304 A1 | 1/2020 |

OTHER PUBLICATIONS

English machine translation of Office Action dated Jan. 9, 2025 issued in KR Appl. No. 10-2023-0033886, 10pp.

English machine translation of Office Action dated on Jul. 31, 2024, in corresponding Taiwanese patent Application No. 112110213, 7 pages.

English machine translation of Office Action dated Dec. 2, 2025 issued in JP Appl. No. 2022-057454, 5pp.

* cited by examiner

PBTS

NBTIS

METHOD FOR MANUFACTURING SEMICONDUCTOR DEVICE

CROSS REFERENCE TO RELATED APPLICATIONS

This application claims the benefit of priority to Japanese Patent Application No. 2022-057454 filed on Mar. 30, 2022, the entire contents of which are incorporated herein by reference.

FIELD

An embodiment of the present invention relates to a method for manufacturing a semiconductor device. In particular, an embodiment of the present invention relates to a method for manufacturing a semiconductor device in which an oxide semiconductor is used as a channel.

BACKGROUND

In recent years, a semiconductor device in which an oxide semiconductor is used for a channel instead of amorphous silicon, low-temperature polysilicon, and single-crystal silicon has been developed (for example, Japanese laid-open patent publication No. 2021-141338, Japanese laid-open patent publication No. 2014-099601, Japanese laid-open patent publication No. 2021-153196, Japanese laid-open patent publication No. 2018-006730, Japanese laid-open patent publication No. 2016-184771, and Japanese laid-open patent publication No. 2021-108405). The semiconductor device in which the oxide semiconductor is used for the channel can be formed with a simple structure and a low-temperature process, similar to a semiconductor device in which amorphous silicon is used as a channel. The semiconductor device in which the oxide semiconductor is used for the channel is known to have higher mobility than the semiconductor device in which amorphous silicon is used for the channel.

It is essential to supply oxygen to an oxide semiconductor layer in the manufacturing process and to reduce the oxygen vacancies formed in the oxide semiconductor layer in order for the semiconductor device in which the oxide semiconductor is used for the channel to perform a stable operation. For example, a technique of forming an insulating layer covering the oxide semiconductor layer under the condition that the insulating layer contains more oxygen is disclosed as one method of supplying oxygen to the oxide semiconductor layer.

However, the insulating layer formed with more oxygen-containing conditions contains more defects. As a result, abnormal characteristics of the semiconductor device or a variation in characteristics in a reliability test occur, which are considered to be caused by electron-trapping in the defect. On the other hand, if an insulating layer with fewer defects is used, oxygen in the insulating layer cannot be increased. Therefore, sufficient oxygen cannot be supplied from the insulating layer to the oxide semiconductor layer. As described above, there is a demand for realizing a structure capable of repairing oxygen vacancies formed in the oxide semiconductor layer while reducing defects in the insulating layer that cause the variation in characteristics of the semiconductor device.

Further, a semiconductor device with high mobility can be obtained by relatively increasing a ratio of indium contained in the oxide semiconductor layer. However, if the ratio of indium contained in the oxide semiconductor layer is high, oxygen vacancies are likely to be formed in the oxide semiconductor layer. Therefore, in order to realize high mobility while maintaining high reliability, it is necessary to devise a configuration of the insulating layer around the oxide semiconductor layer.

SUMMARY

A method for manufacturing semiconductor device according to an embodiment of the present invention includes: forming a first metal oxide layer containing aluminum as a main component above a substrate; forming an oxide semiconductor layer above the first metal oxide layer; forming a gate insulating layer above the oxide semiconductor layer; forming a second metal oxide layer containing aluminum as a main component above the gate insulating layer; performing a heat treatment in a state where the second metal oxide layer is formed above the gate insulating layer; removing the second metal oxide layer after the heat treatment; and forming a gate electrode above the gate insulating layer.

BRIEF DESCRIPTION OF DRAWINGS

FIG. 29 is a cross-sectional view showing an outline of a display device according to an embodiment of the present invention.

DESCRIPTION OF EMBODIMENTS

Figure 1:
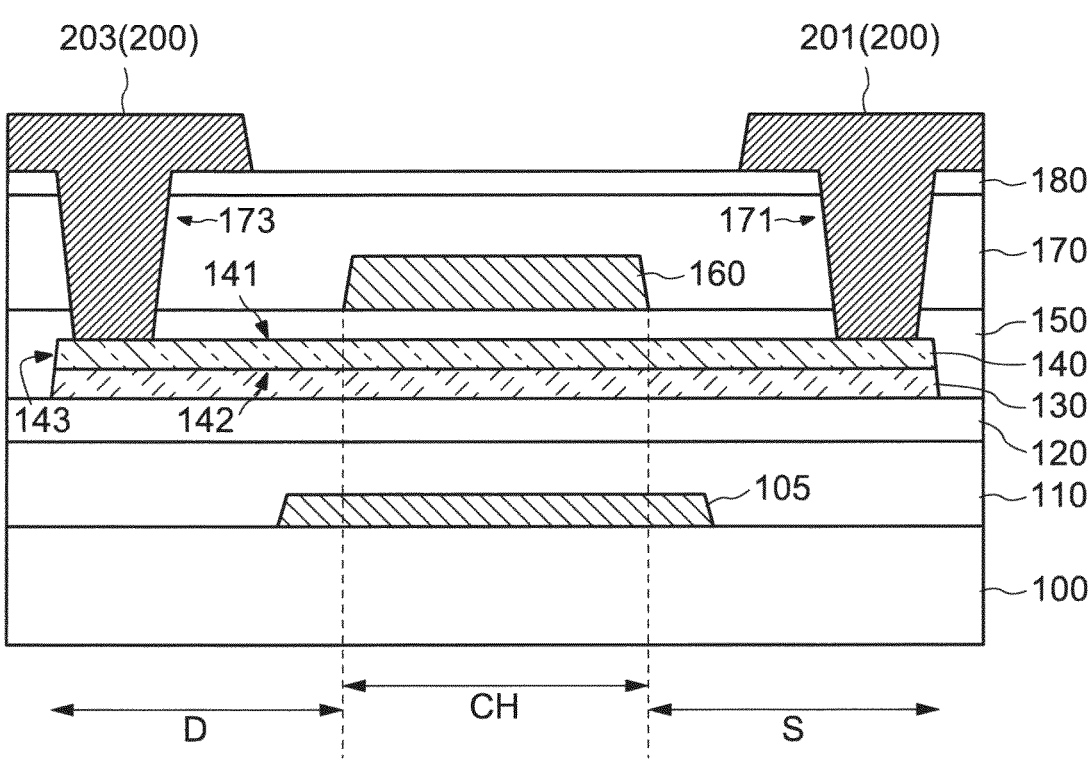
FIG. 1 is a cross-sectional view showing an outline of a semiconductor device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as "on" or "above". Reversely, a direction from the oxide semiconductor layer to the substrate is referred to as "under" or "below". As described above, for convenience of explanation, although the phrase "above (on)" or "below (under)" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying the liquid crystal display device including a liquid crystal layer and an organic EL display device including an organic EL layer as the display device, the structure in the present embodiment can be applied to a display device including the other electro-optic layers described above.

The expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

In addition, the following embodiments may be combined with each other as long as there is no technical contradiction.

An object of the embodiment of the present invention is to realize a highly reliable semiconductor device having high mobility.

First Embodiment

A semiconductor device according to an embodiment of the present invention will be described with reference to FIG. 1 to FIG. 12. For example, a semiconductor device of the embodiment described below may be used in an integrated circuit (IC) such as a micro-processing unit (MPU) or a memory circuit in addition to a transistor used in a display device.

[Configuration of Semiconductor Device 10]

Figure 2:
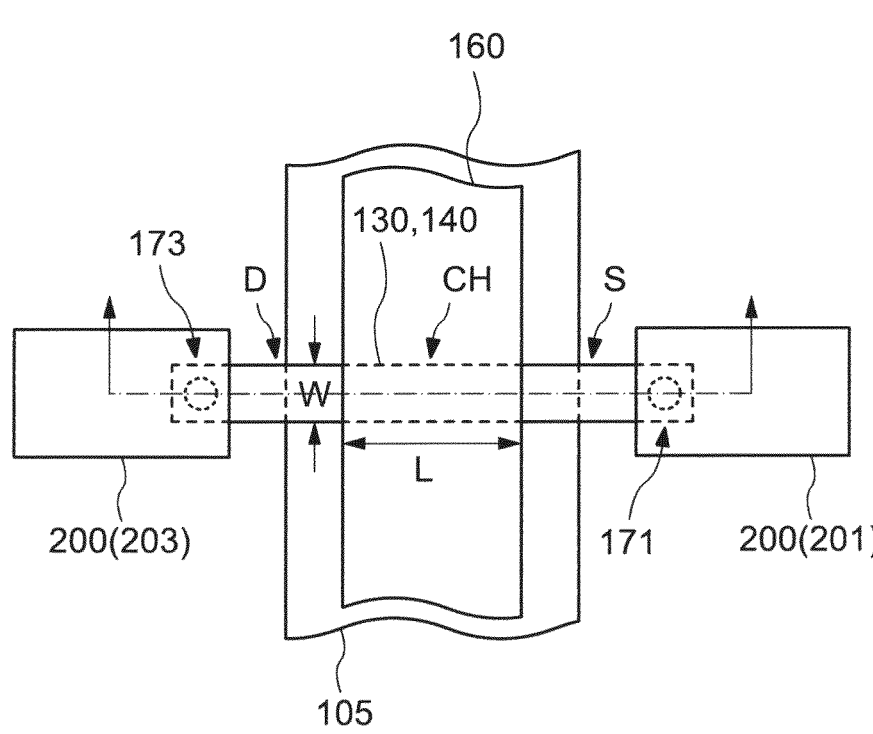
FIG. 2 is a plan view showing an outline of a semiconductor device according to an embodiment of the present invention.
Figure 2:
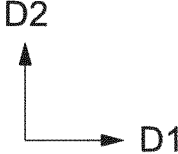

A configuration of a semiconductor device 10 according to an embodiment of the present invention will be described with reference to FIG. 1 and FIG. 2. FIG. 1 is a cross-sectional view showing an outline of a semiconductor device according to an embodiment of the present invention. FIG. 2 is a plan view showing an outline of a semiconductor device according to an embodiment of the present invention.

As shown in FIG. 1, the semiconductor device 10 is arranged above a substrate 100. The semiconductor device 10 includes a gate electrode 105, gate insulating layers 110 and 120, a metal oxide layer 130, an oxide semiconductor layer 140, a gate insulating layer 150, a gate electrode 160, insulating layers 170 and 180, a source electrode 201, and a drain electrode 203. If the source electrode 201 and the drain electrode 203 are not specifically distinguished from each other, they may be referred to as a source-drain electrode 200.

The gate electrode 105 is arranged above the substrate 100. The gate insulating layer 110 and the gate insulating layer 120 are arranged above the substrate 100 and the gate electrode 105. The metal oxide layer 130 is arranged above the gate insulating layer 120. The metal oxide layer 130 is in contact with the gate insulating layer 120. The oxide semiconductor layer 140 is arranged above the metal oxide layer 130. The oxide semiconductor layer 140 is in contact with the metal oxide layer 130. In the main surface of the oxide semiconductor layer 140, a surface in contact with the metal oxide layer 130 is referred to as a lower surface 142. An end portion of the metal oxide layer 130 substantially coincides with an end portion of the oxide semiconductor layer 140.

In the present embodiment, no semiconductor layer or oxide semiconductor layer is arranged between the metal oxide layer 130 and the substrate 100.

In the present embodiment, although a configuration in which the metal oxide layer 130 is in contact with the gate insulating layer 120 and the oxide semiconductor layer 140 is in contact with the metal oxide layer 130 is exemplified, the configuration is not limited to this configuration. Other layers may be arranged between the gate insulating layer 120 and the metal oxide layer 130. Other layers may be arranged between the metal oxide layer 130 and the oxide semiconductor layer 140.

In FIG. 1, although sidewalls of the metal oxide layer 130 and sidewalls of the oxide semiconductor layer 140 are arranged in a straight line, the configuration is not limited to this configuration. An angle of the sidewall of the metal oxide layer 130 with respect to the main surface of the substrate 100 may be different from an angle of the sidewall of the oxide semiconductor layer 140 with respect to the main surface. The cross-sectional shapes of the side wall of at least one of the metal oxide layer 130 and the oxide semiconductor layer 140 may be curved.

The gate electrode 160 faces the oxide semiconductor layer 140. The gate insulating layer 150 is arranged between the oxide semiconductor layer 140 and the gate electrode 160. The gate insulating layer 150 is in contact with the oxide semiconductor layer 140. In the main surface of the oxide semiconductor layer 140, a surface in contact with the gate insulating layer 150 is referred to as an upper surface 141. A surface between the upper surface 141 and the lower surface 142 is referred to as a side surface 143. The insulating layers 170 and 180 are arranged above the gate insulating layer 150 and the gate electrode 160. Openings 171 and 173 that reach the oxide semiconductor layer 140 are arranged in the insulating layers 170 and 180. The source electrode 201 is arranged inside the opening 171. The source electrode 201 is in contact with the oxide semiconductor layer 140 at the bottom of the opening 171. The drain electrode 203 is arranged inside the opening 173. The drain electrode 203 is in contact with the oxide semiconductor layer 140 at the bottom of the opening 173.

The gate electrode 105 has a function as a bottom-gate of the semiconductor device 10 and a function as a light-shielding film for the oxide semiconductor layer 140. The gate insulating layer 110 has a function as a barrier film for shielding impurities that diffuse from the substrate 100 toward the oxide semiconductor layer 140. The gate insulating layers 110 and 120 have a function as a gate insulating layer for the bottom-gate. The metal oxide layer 130 is a layer containing a metal oxide containing aluminum as the main component, and has a function as a gas barrier film for shielding a gas such as oxygen or hydrogen.

The oxide semiconductor layer 140 is divided into a source area S, a drain area D, and a channel area CH. The channel area CH is an area of the oxide semiconductor layer 140 vertically below the gate electrode 160. The source area S is an area of the oxide semiconductor layer 140 that does not overlap the gate electrode 160 and is closer to the source electrode 201 than the channel area CH. The drain area D is an area of the oxide semiconductor layer 140 that does not overlap the gate electrode 160 and is closer to the drain electrode 203 than the channel area CH. The oxide semiconductor layer 140 in the channel area CH has physical properties as a semiconductor. The oxide semiconductor layer 140 in the source area S and the drain area D has physical properties as a conductor.

The gate electrode 160 has a function as a top-gate of the semiconductor device 10 and a light-shielding film for the oxide semiconductor layer 140. The gate insulating layer 150 has a function as a gate insulating layer for the top-gate, and has a function of releasing oxygen by a heat treatment in a manufacturing process. The insulating layers 170 and 180 insulate the gate electrode 160 and the source-drain electrode 200 and have a function of reducing parasitic capacitance therebetween. Operations of the semiconductor device 10 are controlled mainly by a voltage supplied to the gate electrode 160. An auxiliary voltage is supplied to the gate electrode 105. However, in the case of using the gate electrode 105 simply as a light-shielding film, a specific voltage is not supplied to the gate electrode 105, and the gate electrode 105 may be in a floating state. That is, the gate electrode 105 may simply be referred to as a "light-shielding film."

In the present embodiment, although a configuration using a dual-gate transistor in which the gate electrode is arranged both above and below the oxide semiconductor layer as the semiconductor device 10 is exemplified, the configuration is not limited to this configuration. For example, a bottom-gate transistor in which the gate electrode is arranged only below the oxide semiconductor layer or a top-gate transistor in which the gate electrode is arranged only above the oxide semiconductor layer may be used as the semiconductor device 10. The above configuration is merely an embodiment, and the present invention is not limited to the above configuration.

As shown in FIG. 2, in a plan view, a planar pattern of the metal oxide layer 130 is substantially the same as a planar pattern of the oxide semiconductor layer 140. Referring to FIG. 1 and FIG. 2, the lower surface 142 of the oxide semiconductor layer 140 is covered with the metal oxide layer 130. In particular, in the present embodiment, all of the lower surface 142 of the oxide semiconductor layer 140 is covered with the metal oxide layer 130. In a direction D1, a width of the gate electrode 105 is greater than a width of the gate electrode 160. The direction D1 is a direction connecting the source electrode 201 and the drain electrode 203, and is a direction indicating a channel length L of the semiconductor device 10. Specifically, a length in the direction D1 in the area (the channel area CH) where the oxide semiconductor layer 140 and the gate electrode 160 overlap is the channel length L, and a width in a direction D2 in the channel area CH is a channel width W.

In the present embodiment, although a configuration in which all of the lower surface 142 of the oxide semiconductor layer 140 is covered with the metal oxide layer 130 is exemplified, the present invention is not limited to this configuration. For example, a part of the lower surface 142 of the oxide semiconductor layer 140 may not be in contact with the metal oxide layer 130. For example, all of the lower surface 142 of the oxide semiconductor layer 140 in the channel area CH may be covered with the metal oxide layer 130, and all or part of the lower surface 142 of the oxide semiconductor layer 140 in the source area S and the drain area D may not be covered with the metal oxide layer 130. That is, all or part of the lower surface 142 of the oxide semiconductor layer 140 in the source area S and the drain area D may not be in contact with the metal oxide layer 130. However, in the above configuration, a part of the lower surface 142 of the oxide semiconductor layer 140 in the channel area CH may not be covered with the metal oxide layer 130, and the other part of the lower surface 142 may be in contact with the metal oxide layer 130.

In the present embodiment, although a configuration in which the gate insulating layer 150 is formed on the entire surface and the openings 171 and 173 are arranged in the gate insulating layer 150 is exemplified, the configuration is not limited to this configuration. The gate insulating layer 150 may be patterned in a shape that is different from the shape in which the openings 171 and 173 are arranged. For example, the gate insulating layer 150 may be patterned to expose all or part of the oxide semiconductor layer 140 in the source area S and the drain area D. That is, the gate insulating layer 150 in the source area S and the drain area D may be removed, and the oxide semiconductor layer 140 and the insulating layer 170 may be in contact with each other in these areas.

In FIG. 2, although a configuration in which the source-drain electrode 200 does not overlap the gate electrode 105 and the gate electrode 160 in a plan view is exemplified, the configuration is not limited to this configuration. For example, in a plan view, the source-drain electrode 200 may overlap at least one of the gate electrode 105 and the gate electrode 160. The above configuration is merely an embodiment, and the present invention is not limited to the above configuration.

[Material of Each Member of Semiconductor Device 10]

A rigid substrate having translucency, such as a glass substrate, a quartz substrate, a sapphire substrate, or the like, is used as the substrate 100. In the case where the substrate 100 needs to have flexibility, a substrate containing a resin such as a polyimide substrate, an acryl substrate, a siloxane substrate, or a fluororesin substrate is used as the substrate 100. In the case where the substrate containing a resin is used as the substrate 100, impurities may be introduced into the resin in order to improve the heat resistance of the substrate 100. In particular, in the case where the semiconductor device 10 is a top-emission display, since the substrate 100 does not need to be transparent, impurities that deteriorate the translucency of the substrate 100 may be used. In the case where the semiconductor device 10 is used for an integrated circuit that is not a display device, a substrate without translucency such as a semiconductor substrate such as a silicon substrate, a silicon carbide substrate, a compound semiconductor substrate, or a conductive substrate such as a stainless substrate is used as the substrate 100.

Common metal materials are used for the gate electrode 105, the gate electrode 160, and the source-drain electrode 200. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys thereof or compounds thereof are used as these members. The above-described materials may be used in a single layer or in a stacked layer as the gate electrode 105, the gate electrode 160, and the source-drain electrode 200.

Common insulating materials are used for the gate insulating layers 110 and 120 and the insulating layers 170 and 180. For example, insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) are used as the inorganic insulating layers.

Among the above-described insulating layers, the insulating layer containing oxygen is used as the gate insulating layer 150. For example, an inorganic insulating layer such as silicon oxide ($SiO_x$), silicon oxynitride ($SiO_xN_y$), aluminum oxide ($AlO_x$), and aluminum oxynitride ($AlO_xN_y$) is used as the gate insulating layer 150.

An insulating layer having a function of releasing oxygen by a heat treatment is used as the gate insulating layer 120. For example, the temperature of the heat treatment at which the gate insulating layer 120 releases oxygen is 600° C. or less, 500° C. or less, 450° C. or less, or 400° C. or less. That is, for example, in the case where the glass substrate is used as the substrate 100, the gate insulating layer 120 releases oxygen at the heat treatment temperature performed in the manufacturing process of the semiconductor device 10.

An insulating layer with few defects is used as the gate insulating layer 150. For example, when a composition ratio of oxygen in the gate insulating layer 150 is compared with a composition ratio of oxygen in an insulating layer (hereinafter referred to as "other insulating layer") having a composition similar to that of the gate insulating layer 150, the composition ratio of oxygen in the gate insulating layer 150 is closer to the stoichiometric ratio with respect to the insulating layer than the composition ratio of oxygen in that other insulating layer. Specifically, in the case where silicon oxide ($SiO_x$) is used for each of the gate insulating layer 150 and the insulating layer 180, the composition ratio of oxygen in the silicon oxide used as the gate insulating layer 150 is close to the stoichiometric ratio of silicon oxide as compared with the composition ratio of oxygen in the silicon oxide used as the insulating layer 180. For example, a layer in which no defects are observed when evaluated by the electron-spin resonance (ESR) may be used as the gate insulating layer 150.

$SiO_xN_y$ and $AlO_xN_y$ described above are a silicon compound and an aluminum compound containing nitrogen (N) in a ratio (x>y) smaller than that of oxygen (O). $SiN_xO_y$ and $AlN_xO_y$ are a silicon compound and an aluminum compound containing oxygen in a ratio (x>y) smaller than that of nitrogen.

A metal oxide containing aluminum as the main component is used as the metal oxide layer 130 and a metal oxide layer 190 used in the manufacturing process as described later. For example, an inorganic insulating layer such as aluminum oxide ($AlO_x$), aluminum oxynitride ($AlO_xN_y$), aluminum nitride oxide ($AlN_xO_y$), or aluminum nitride ($AlN_x$) is used as the metal oxide layer 130 (or the metal oxide layer 190). The "metal oxide layer containing aluminum as the main component" means that the ratio of aluminum contained in the metal oxide layer 130 (or the metal oxide layer 190) is 1% or more of the total amount of the metal oxide layer 130 (or the metal oxide layer 190). The ratio of aluminum contained in the metal oxide layer 130 (or the metal oxide layer 190) may be 5% or more and 70% or less, 10% or more and 60% or less, or 30% or more and 50% or less of the total amount of the metal oxide layer 130. The above ratio may be a mass ratio or a weight ratio.

A metal oxide having semiconductor properties is used as the oxide semiconductor layer 140. For example, an oxide semiconductor containing two or more metals containing indium (In) is used as the oxide semiconductor layer 140. The ratio of indium to the entire oxide semiconductor layer 140 is 50% or more. Gallium (Ga), zinc (Zn), aluminum (Al), hafnium (Hf), yttrium (Y), zirconia (Zr), and lanthanoids are used as the oxide semiconductor layer 140 in addition to indium. Elements other than those described above may be used for the oxide semiconductor layer 140.

The oxide semiconductor layer 140 may be amorphous or crystalline. The oxide semiconductor layer 140 may be a mixed phase of amorphous and crystalline. Oxygen vacancies are likely to be formed in the oxide semiconductor layer 140 in which the ratio of indium is 50% or more, as described below. Oxygen vacancies are less likely to be formed in a crystalline oxide semiconductor as compared with an amorphous oxide semiconductor. Therefore, the oxide semiconductor layer 140 as described above is preferably crystalline.

[Problems Newly Recognized]

In the case where the ratio of indium in the oxide semiconductor layer 140 is 50% or more, the semiconductor device 10 with high mobility is realized. On the other hand, since the oxygen contained in the oxide semiconductor layer 140 is easily reduced in such an oxide semiconductor layer 140, oxygen vacancies are easily formed in the oxide semiconductor layer 140.

In the semiconductor device 10, hydrogen is released from a layer (for example, the gate insulating layers 110 and 120) arranged closer to the substrate 100 side than the oxide semiconductor layer 140 in the heat treatment step of the manufacturing process. When the hydrogen reaches the oxide semiconductor layer 140, oxygen vacancies occur in the oxide semiconductor layer 140. The occurrence of the oxygen vacancies is more pronounced the larger the pattern size of the oxide semiconductor layer 140 becomes. In order to suppress the occurrence of such oxygen vacancies, it is necessary to suppress hydrogen from reaching the lower surface 142 of the oxide semiconductor layer 140. This is the first problem.

Apart from the above problem, there is a second problem shown below. The upper surface 141 of the oxide semiconductor layer 140 is affected by a process (for example, a patterning process or an etch process) after the oxide semiconductor layer 140 is formed. On the other hand, the lower surface 142 of the oxide semiconductor layer 140 (the surface of the oxide semiconductor layer 140 facing the substrate 100) is not affected as described above.

Therefore, there are more oxygen vacancies formed near the upper surface 141 of the oxide semiconductor layer 140 than the oxygen vacancies formed near the lower surface 142 of the oxide semiconductor layer 140. That is, the oxygen vacancies in the oxide semiconductor layer 140 do not exist uniformly in a thickness direction of the oxide semiconductor layer 140, but exist in a non-uniform distribution in the thickness direction of the oxide semiconductor layer 140. Specifically, there are fewer oxygen vacancies in the oxide semiconductor layer 140 toward the lower surface 142 side of the oxide semiconductor layer 140 and more oxygen vacancies toward the upper surface 141 side of the oxide semiconductor layer 140.

In the case where an oxygen supply process is uniformly performed on the oxide semiconductor layer 140 having the oxygen vacancy distribution as described above, oxygen is excessively supplied to the lower surface 142 side of the oxide semiconductor layer 140 when supplying oxygen in an amount required to repair the oxygen vacancies formed on the upper surface 141 side of the oxide semiconductor layer 140. As a result, a defect level different from the oxygen vacancies is formed on the lower surface 142 side due to the excess oxygen. As a result, phenomenon such as variation in characteristics in the reliability test or a decrease in field-effect mobility occurs. Therefore, in order to suppress such phenomenon, it is necessary to supply oxygen to the upper surface 141 side of the oxide semiconductor layer 140 while suppressing the oxygen supply to the lower surface 142 side of the oxide semiconductor layer 140.

The above problems are newly recognized in the process of reaching the present invention but are not problems that have been conventionally recognized. In the conventional configuration and manufacturing method, there was a trade-off relationship between the initial characteristics and the reliability test, in which the variation in characteristics according to the reliability test occurs even when the initial characteristics of the semiconductor device are improved by the oxygen supply process to the oxide semiconductor layer. However, with the configuration according to the present embodiment, the above problems are solved, and it is possible to obtain good initial characteristics and a reliability test result of the semiconductor device 10.

[Method for Manufacturing Semiconductor Device 10]

Figure 3:
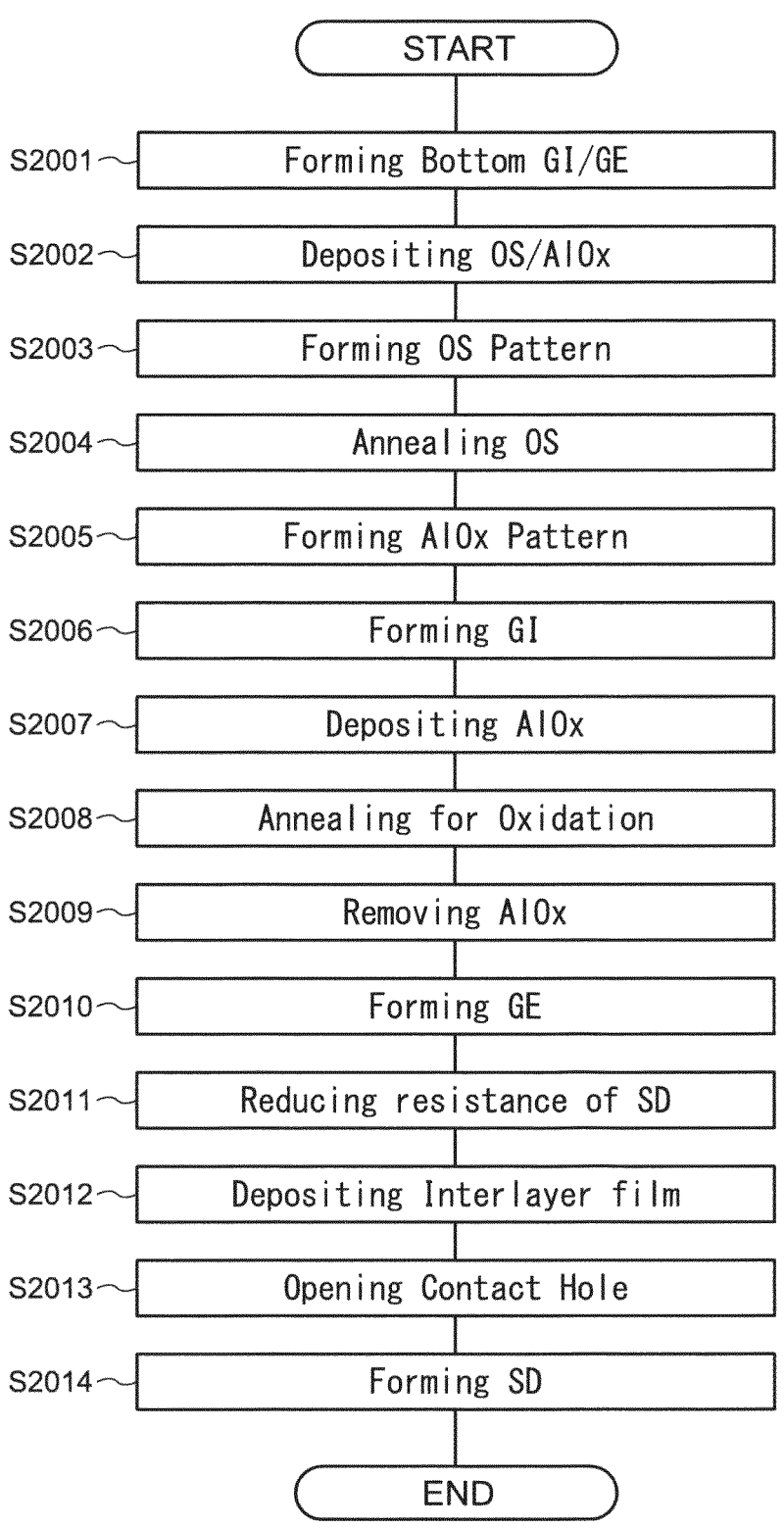
FIG. 3 is a sequence diagram showing a method for manufacturing a semiconductor device according to an embodiment of the present invention.

A method for manufacturing a semiconductor device according to an embodiment of the present invention will be described with reference to FIG. 3 to FIG. 12. FIG. 3 is a sequence diagram showing a method for manufacturing a semiconductor device according to an embodiment of the present invention. FIG. 4 to FIG. 12 are cross-sectional views showing a method for manufacturing a semiconductor device according to an embodiment of the present invention. In the description of the manufacturing method shown below, a method for manufacturing the semiconductor device 10 in which aluminum oxide is used as the metal oxide layers 130 and 190 will be described.

Figure 4:
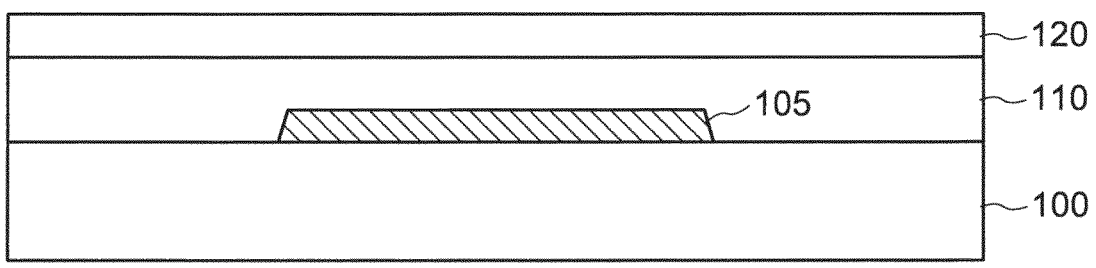
FIG. 4 is a cross-sectional view showing a method for manufacturing a semiconductor device according to an embodiment of the present invention.

As shown in FIG. 3 and FIG. 4, the gate electrode 105 is formed on the substrate 100 as the bottom-gate, and the gate insulating layers 110 and 120 are formed on the gate electrode 105 ("Forming Bottom GI/GE" in step S2001 of FIG. 3). For example, silicon nitride is formed as the gate insulating layer 110. For example, silicon oxide is formed as the gate insulating layer 120. The gate insulating layers 110 and 120 are formed by a CVD (Chemical Vapor Deposition) method. One or both of the gate insulating layers 110 and 120 may be referred to as a "first insulating layer."

Using silicon nitride as the gate insulating layer 110 allows the gate insulating layer 110 to block impurities that diffuse, for example, from the substrate 100 toward the oxide semiconductor layer 140. The silicon oxide used as the gate insulating layer 120 is silicon oxide having a physical property of releasing oxygen by a heat treatment.

Figure 5:
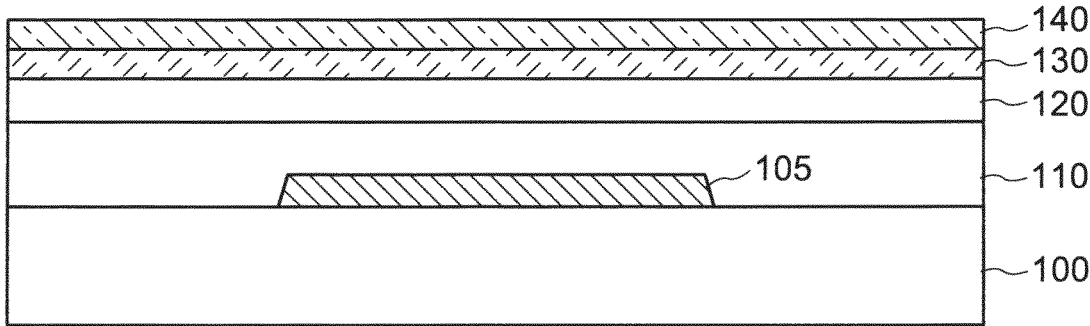
FIG. 5 is a cross-sectional view showing a method for manufacturing a semiconductor device according to an embodiment of the present invention.

As shown in FIG. 3 and FIG. 5, the metal oxide layer 130 and the oxide semiconductor layer 140 are formed on the gate insulating layer 120 ("Depositing OS/AlO$_x$" in step S2002 of FIG. 3). For this process, it can be said that the gate insulating layers 110 and 120 are formed above the substrate 100, and the metal oxide layer 130 is formed above the gate insulating layers 110 and 120. Alternatively, it can be said that the metal oxide layer 130 is formed above the substrate 100, and the oxide semiconductor layer 140 is formed above the metal oxide layer 130. Specifically, the oxide semiconductor layer 140 is formed to be in contact with the metal oxide layer 130. The metal oxide layer 130 and the oxide semiconductor layer 140 are deposited by a sputtering method or an atomic layer deposition method (ALD).

For example, a thickness of the metal oxide layer 130 is 1 nm or more and 100 nm or less, 1 nm or more and 50 nm or less, 1 nm or more and 30 nm or less, or 1 nm or more and 10 nm or less. In the present embodiment, aluminum oxide is used as the metal oxide layer 130. Aluminum oxide has a high barrier property against gas. In the present embodiment, the aluminum oxide used as the metal oxide layer 130 blocks hydrogen and oxygen released from the gate insulating layer 120, and suppresses the released hydrogen and oxygen from reaching the oxide semiconductor layer 140.

For example, a thickness of the oxide semiconductor layer 140 is 10 nm or more and 100 nm or less, 15 nm or more and 70 nm or less, or 20 nm or more and 40 nm or less. The oxide semiconductor layer 140 before the heat treatment (OS anneal) described later is amorphous.

When the oxide semiconductor layer 140 is crystallized by the OS anneal described later, the oxide semiconductor layer 140 after the deposition and before the OS anneal is preferably in an amorphous state (a state in which there are less low crystalline components of the oxide semiconductor). That is, the deposition conditions of the oxide semiconductor layer 140 are preferred to be such that the oxide semiconductor layer 140 immediately after the deposition does not crystallize as much as possible. For example, in the case where the oxide semiconductor layer 140 is deposited by the sputtering method, the oxide semiconductor layer 140 is deposited in a state where the temperature of the object to be deposited (the substrate 100 and structures formed thereon) is controlled.

In the case where the deposition is performed on the object to be deposited by the sputtering method, ions generated in the plasma and atoms recoiled by a sputtering target collide with the object to be deposited. Therefore, the temperature of the object to be deposited rises with the deposition process. When the temperature of the object to be deposited rises during the deposition process, microcrystals occur in the oxide semiconductor layer 140 immediately after the deposition process. The microcrystals inhibit crystallization by a subsequent OS anneal. For example, in order to control the temperature of the object to be deposited as described above, deposition may be performed while cooling the object to be deposited. For example, the object to be deposited may be cooled from a surface opposite to a deposited surface so that the temperature of the deposited surface of the object to be deposited (hereinafter, referred to as "deposition temperature") is 100° C. or less, 70° C. or less, 50° C. or less, or 30° C. or less. As described above, depositing the oxide semiconductor layer 140 while cooling the object to be deposited makes it possible to deposit the oxide semiconductor layer 140 with few crystalline components in a state immediately after the deposition.

Figure 6:
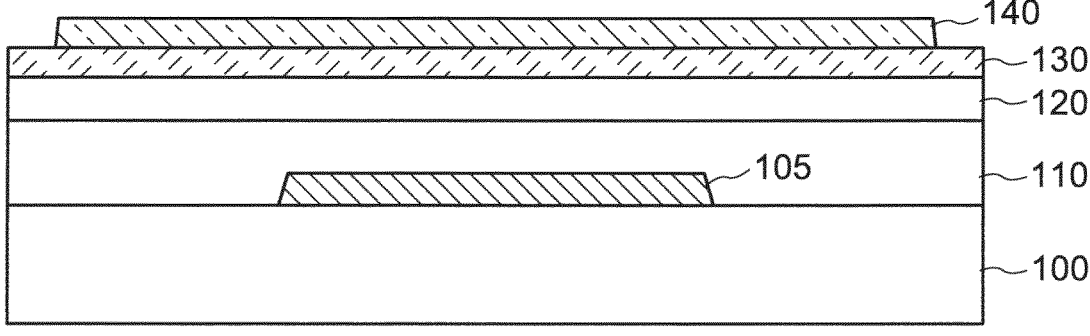
FIG. 6 is a cross-sectional view showing a method for manufacturing a semiconductor device according to an embodiment of the present invention.

As shown in FIG. 3 and FIG. 6, a pattern of the oxide semiconductor layer 140 is formed ("Forming OS Pattern" in step S2003 of FIG. 3). Although not shown, a resist mask is formed on the oxide semiconductor layer 140, and the oxide semiconductor layer 140 is etched using the resist mask. Wet etching may be used, or dry etching may be used as the etching method of the oxide semiconductor layer 140. The wet etching may include etching using an acidic etchant. For example, oxalic acid or hydrofluoric acid may be used as the etchant.

A heat treatment (OS anneal) ("Annealing OS" in step S2004 of FIG. 3) is performed on the oxide semiconductor layer 140 after the pattern of the oxide semiconductor layer 140 is formed. In the present embodiment, the oxide semiconductor layer 140 is crystallized by the OS anneal.

Figure 7:
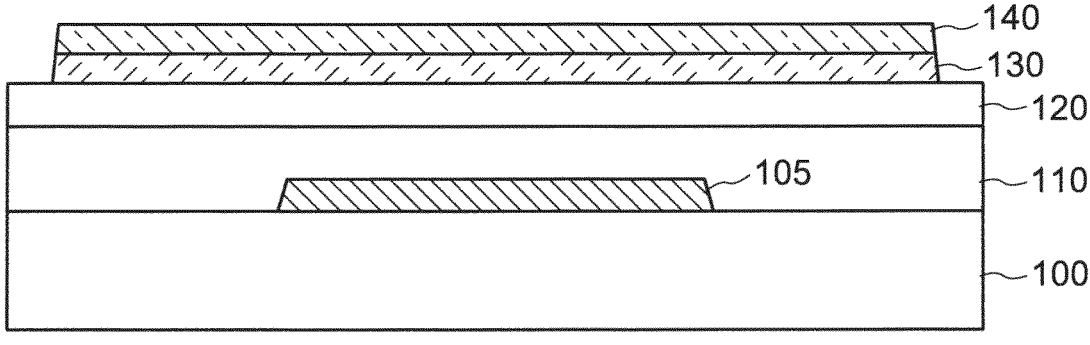
FIG. 7 is a cross-sectional view showing a method for manufacturing a semiconductor device according to an embodiment of the present invention.

As shown in FIG. 3 and FIG. 7, a pattern of the metal oxide layer 130 is formed ("Forming AlO$_x$ Pattern" in step S2005 of FIG. 3). The metal oxide layer 130 is etched using the oxide semiconductor layer 140 patterned in the above process as a mask. Wet etching may be used, or dry etching may be used as the etching method of the metal oxide layer 130. For example, dilute hydrofluoric acid (DHF) is used for the wet etching. As described above, a photolithography process can be omitted by etching the metal oxide layer 130 using the oxide semiconductor layer 140 as the mask.

Figure 8:
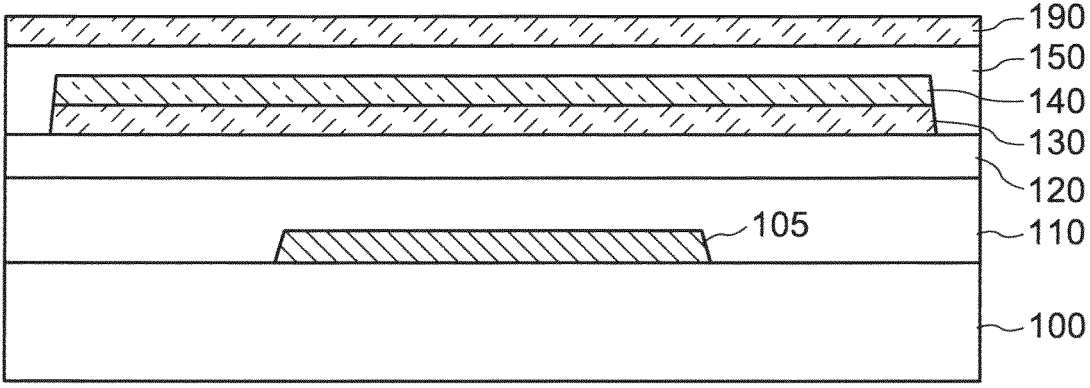
FIG. 8 is a cross-sectional view showing a method for manufacturing a semiconductor device according to an embodiment of the present invention.

As shown in FIG. 3 and FIG. 8, the gate insulating layer 150 is deposited on the oxide semiconductor layer 140 ("Forming GI" in step S2006 of FIG. 3). For example, silicon oxide is formed as the gate insulating layer 150. The gate insulating layer 150 is formed by the CVD method. For example, the gate insulating layer 150 may be deposited at a deposition temperature of 350° C. or higher in order to form an insulating layer having few defects as described above as the gate insulating layer 150. For example, the thickness of the gate insulating layer 150 is 50 nm or more and 300 nm or less, 60 nm or more and 200 nm or less, or 70 nm or more and 150 nm or less. A process of implanting oxygen may be performed on a part of the gate insulating layer 150 after the gate insulating layer 150 is deposited. The gate insulating layer 150 may be referred to as a "second insulating layer." The metal oxide layer 190 is deposited on the gate insulating layer 150 ("Depositing AlO$_x$" in step S2007 of FIG. 3). The metal oxide layer 190 is formed by the sputtering method. Oxygen is implanted into the gate insulating layer 150 by the deposition of the metal oxide layer 190.

For example, a thickness of the metal oxide layer 190 is 5 nm or more and 100 nm or less, 5 nm or more and 50 nm or less, 5 nm or more and 30 nm or less, or 7 nm or more and 15 nm or less. In the present embodiment, aluminum oxide is used as the metal oxide layer 190. Aluminum oxide has a high barrier property against gas. In the present embodiment, the aluminum oxide used as the metal oxide layer 190 suppresses the oxygen implanted into the gate insulating layer 150 at the time of the deposition of the metal oxide layer 190 from diffusing outward.

For example, in the case where the metal oxide layer 190 is formed by the sputtering method, a process gas used in the sputtering remains in the film of the metal oxide layer 190. For example, in the case where Ar is used as the process gas for sputtering, Ar may remain in the film of the metal oxide layer 190. The remaining Ar can be detected by a SIMS (Secondary Ion Mass Spectrometry) analysis on the metal oxide layer 190.

A heat treatment (oxidation anneal) for supplying oxygen to the oxide semiconductor layer 140 is performed in a state where the gate insulating layer 150 is deposited on the oxide semiconductor layer 140 and the metal oxide layer 190 is deposited on the gate insulating layer 150 ("Annealing for Oxidation" in step S2008 of FIG. 3). In other words, the heat treatment (oxidation anneal) is performed on the metal oxide layer 130 and the oxide semiconductor layer 140 patterned as described above. In the process from the deposition of the oxide semiconductor layer 140 to the deposition of the gate insulating layer 150 on the oxide semiconductor layer 140, a large amount of oxygen vacancies occurs in the upper surface 141 and the side surface 143 of the oxide semiconductor layer 140. Oxygen released from the gate insulating layers 120 and 150 is supplied to the oxide semiconductor layer 140 by the above-described oxidation anneal, and the oxygen vacancies are repaired.

Oxygen released from the gate insulating layer 120 by the oxidation anneal is blocked by the metal oxide layer 130. Therefore, oxygen is less likely to be supplied to the lower surface 142 of the oxide semiconductor layer 140. The oxygen released from the gate insulating layer 120 diffuses from an area where the metal oxide layer 130 is not formed to the gate insulating layer 150 arranged on the gate insulating layer 120 and reaches the oxide semiconductor layer 140 via the gate insulating layer 150. As a result, the oxygen released from the gate insulating layer 120 is less likely to be supplied to the lower surface 142 of the oxide semiconductor layer 140, and is mainly supplied to the side surface 143 and the upper surface 141 of the oxide semiconductor layer 140. Further, the oxidation anneal makes it possible to supply oxygen released from the gate insulating layer 150 to the upper surface 141 and the side surface 143 of the oxide semiconductor layer 140. The oxidation anneal may release hydrogen from the gate insulating layers 110 and 120 but the hydrogen is blocked by the metal oxide layer 130.

As described above, in the oxidation anneal step, it is possible to supply oxygen to the upper surface 141 and the side surface 143 of the oxide semiconductor layer 140 having a large amount of oxygen vacancies while suppressing the supply of oxygen to the lower surface 142 of the oxide semiconductor layer 140 having a small amount of oxygen vacancies.

Similarly, in the oxidation anneal step described above, the oxygen implanted in the gate insulating layer 150 is blocked by the metal oxide layer 190. Therefore, discharge of the oxygen to the atmosphere is suppressed. As a result, the oxygen is efficiently supplied to the oxide semiconductor layer 140 by the oxidation anneal, and the oxygen vacancies are repaired.

Figure 9:
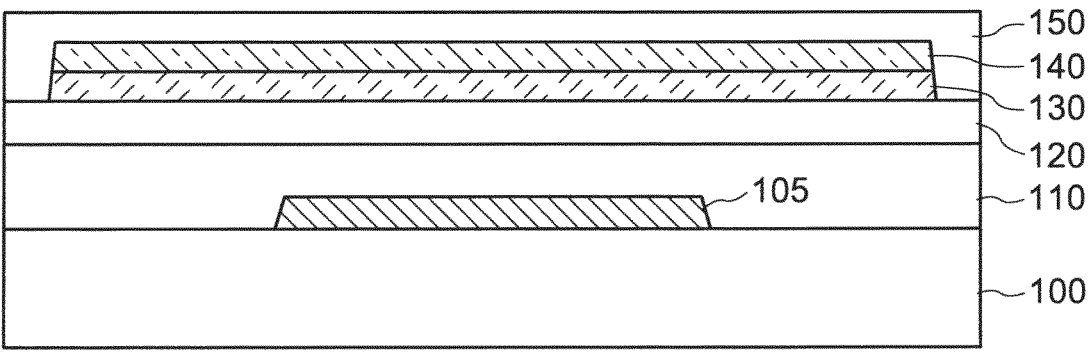
FIG. 9 is a cross-sectional view showing a method for manufacturing a semiconductor device according to an embodiment of the present invention.

As shown in FIG. 3 and FIG. 9, the metal oxide layer 190 is etched (removed) after the oxidation anneal ("Removing $AlO_x$" in step S2009 of FIG. 3). Wet etching may be used, or dry etching may be used as the etching method of the metal oxide layer 190. For example, dilute hydrofluoric acid (DHF) is used for the wet etching. The metal oxide layer 190 formed on the entire surface is removed by the etching. In other words, the removal of the metal oxide layer 190 is performed without using a mask. In other words, all of the oxide layer 190 in an area overlapping the oxide semiconductor layer 140 formed in one pattern is removed in at least a plan view by the etching.

Figure 10:
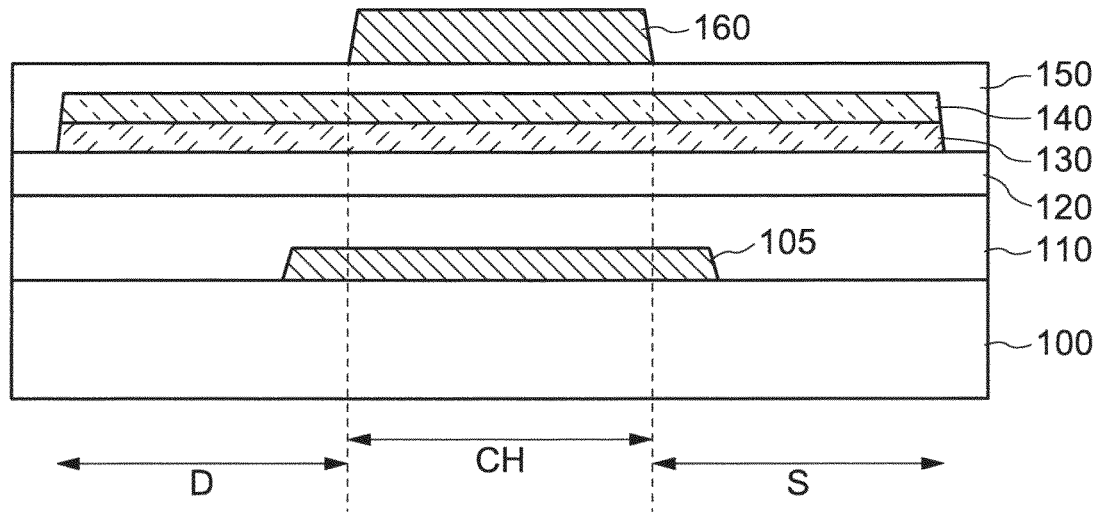
FIG. 10 is a cross-sectional view showing a method for manufacturing a semiconductor device according to an embodiment of the present invention.

As shown in FIG. 3 and FIG. 10, the gate electrode 160 is deposited on the gate insulating layer 150 ("Forming GE"

in step S2010 of FIG. 3). The gate electrode 160 is deposited by the sputtering method or the atomic layer deposition method and patterned through the photolithography process. As described above, the gate electrode 160 is formed to be in contact with the gate insulating layer 150 exposed by removing the metal oxide layer 190.

Resistances of the source area S and the drain area D of the oxide semiconductor layer 140 are reduced ("Reducing resistance of SD" in step S2011 of FIG. 3) in a state where the gate electrode 160 is patterned. Specifically, impurities are implanted into the oxide semiconductor layer 140 from the gate electrode 160 side via the gate insulating layer 150 by ion implantation. For example, argon (Ar), phosphorus (P), and boron (B) are implanted into the oxide semiconductor layer 140 by the ion implantation. Oxygen vacancies are formed in the oxide semiconductor layer 140 by the ion implantation, thereby reducing the resistance of the oxide semiconductor layer 140. Since the gate electrode 160 is arranged above the oxide semiconductor layer 140 functioning as the channel area CH of the semiconductor device 10, impurities are not implanted into the oxide semiconductor layer 140 in the channel area CH.

Figure 11:
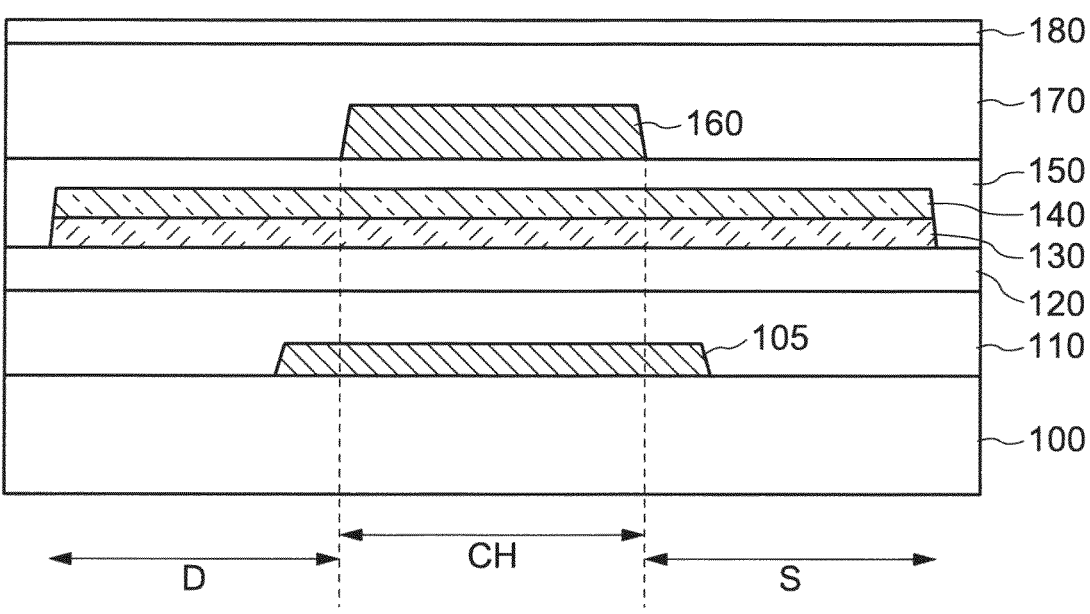
FIG. 11 is a cross-sectional view showing a method for manufacturing a semiconductor device according to an embodiment of the present invention.

As shown in FIG. 3 and FIG. 11, the insulating layers 170 and 180 are deposited on the gate insulating layer 150 and the gate electrode 160 as interlayer films ("Depositing Interlayer film" in step S2012 of FIG. 3). The insulating layers 170 and 180 are deposited by the CVD method. For example, silicon nitride is formed as the insulating layer 170, and silicon oxide is formed as the insulating layer 180. The materials used as the insulating layers 170 and 180 are not limited to the above. A thickness of the insulating layer 170 is 50 nm or more and 500 nm or less. A thickness of the insulating layer 180 is 50 nm or more and 500 nm or less.

Figure 12:
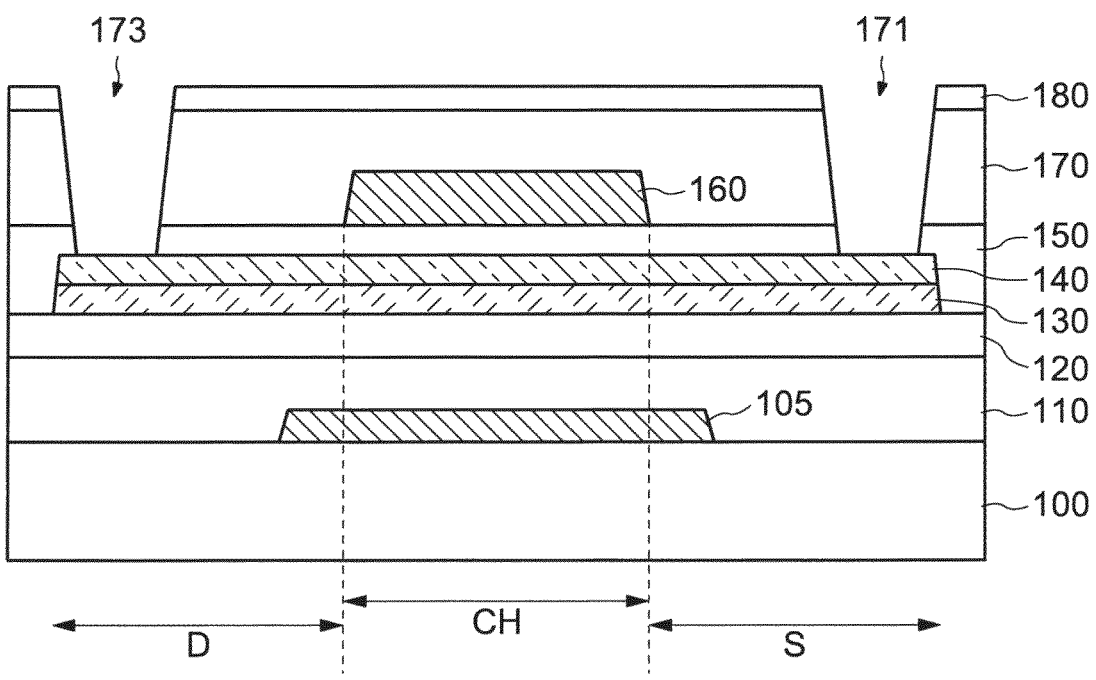
FIG. 12 is a cross-sectional view showing a method for manufacturing a semiconductor device according to an embodiment of the present invention.

As shown in FIG. 3 and FIG. 12, the openings 171 and 173 are formed in the gate insulating layer 150 and the insulating layers 170 and 180 ("Opening Contact Hole" in step S2013 of FIG. 3). The oxide semiconductor layer 140 in the source area S is exposed by the opening 171. The oxide semiconductor layer 140 in the drain area D is exposed by the opening 173. The semiconductor device 10 shown in FIG. 1 is completed by forming the source-drain electrode 200 on the oxide semiconductor layer 140 exposed by the openings 171 and 173 and on the insulating layer 180 ("Forming SD" in step S2014 of FIG. 3).

With respect to the semiconductor device 10 manufactured by the above-described manufacturing method, it is possible to obtain electrical characteristics having a mobility of 50 [cm²/Vs] or more, 55 [cm²/Vs] or more, or 60 [cm²/Vs] or more in a range where the channel length L of the channel area CH is 2 μm or more and 4 μm or less and the channel width of the channel area CH is 2 μm or more and 25 μm or less. The mobility in the present embodiment is the field-effect mobility in a saturation area in the electrical characteristics of the semiconductor device 10. Specifically, the mobility means the largest value of the field-effect mobility in an area where a potential difference (Vd) between the source electrode and the drain electrode is greater than a value (Vg-Vth) that a threshold-voltage (Vth) of the semiconductor device 10 is subtracted from a voltage (Vg) supplied to the gate electrode.

Modification 1 of First Embodiment

Modification 1 of the present embodiment will be described with reference to FIG. 13 to FIG. 15. Although a structure of the semiconductor device 10 according to Modification 1 is the same as that of FIG. 1, the method for manufacturing thereof is different from that of FIG. 3 to FIG. 12. In the following description, the description of the manufacturing method common to the manufacturing method shown in FIG. 3 to FIG. 12 is omitted, and the manufacturing method relating to the difference between the two manufacturing methods will be mainly described.

Figure 13:
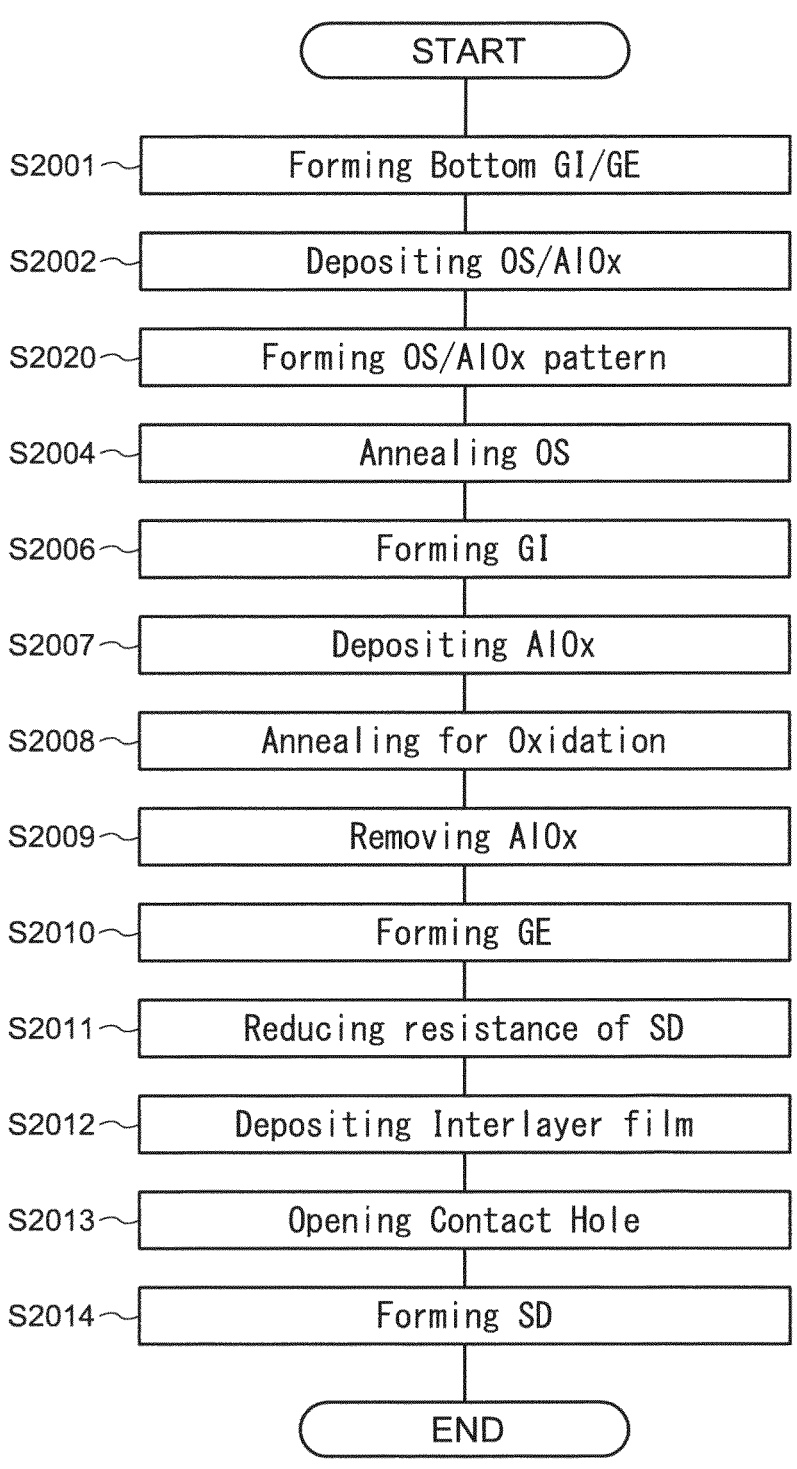
FIG. 13 is a sequence diagram showing a method for manufacturing a semiconductor device according to a modification of an embodiment of the present invention.

FIG. 13 is a sequence diagram showing a method for manufacturing a semiconductor device according to a modification of an embodiment of the present invention. FIG. 14 and FIG. 15 are cross-sectional views showing a manufacturing process of a semiconductor device according to a modification of an embodiment of the present invention. As shown in FIG. 13, in Modification 1, patterns of the metal oxide layer 130 and the oxide semiconductor layer 140 are collectively formed ("Forming OS/AlO$_x$ pattern" in step S2020). That is, the heat treatments (OS anneal and oxidation anneal) are performed on the patterned metal oxide layer 130 and the oxide semiconductor layer 140.

Figure 14:
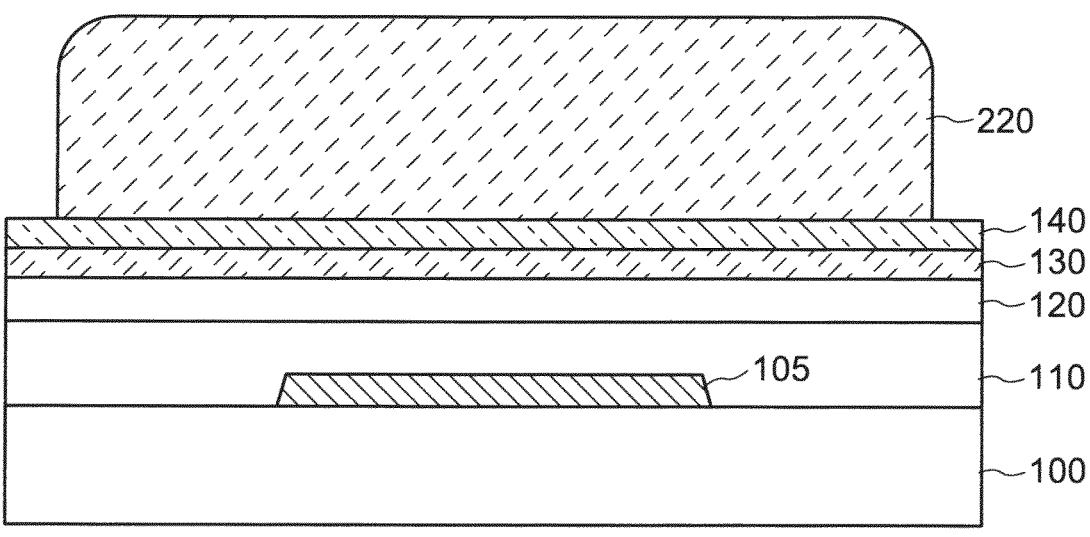
FIG. 14 is a cross-sectional view showing a method for manufacturing a semiconductor device according to a modification of an embodiment of the present invention.
Figure 15:
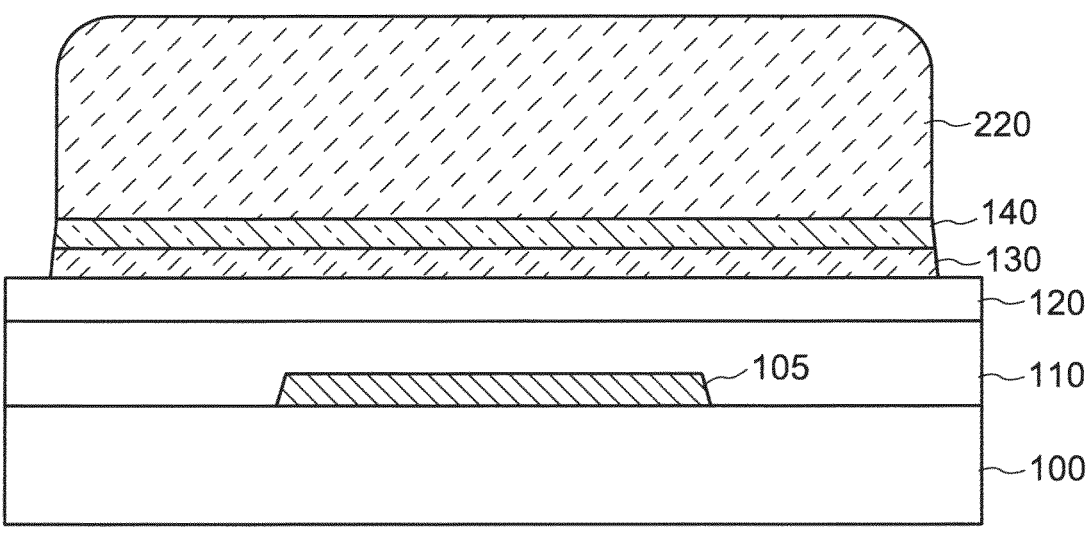
FIG. 15 is a cross-sectional view showing a method for manufacturing a semiconductor device according to a modification of an embodiment of the present invention.

As shown in FIG. 14, a resist mask 220 is formed on the oxide semiconductor layer 140 after the metal oxide layer 130 and the oxide semiconductor layer 140 are deposited. Then, as shown in FIG. 15, the patterns of the metal oxide layer 130 and the oxide semiconductor layer 140 are formed using the resist mask 220. Wet etching may be used, or dry etching may be used as the etching method of the metal oxide layer 130 and the oxide semiconductor layer 140. In the case where the metal oxide layer 130 and the oxide semiconductor layer 140 are etched by the wet etching, an etchant similar to that described above can be used. In Modification 1, the OS anneal is performed in a state where the patterns of the metal oxide layer 130 and the oxide semiconductor layer 140 are formed (step S2004). Since the subsequent steps S2006 to S2014 are the same as those in FIG. 3, detailed descriptions thereof will be omitted.

Modification 2 of First Embodiment

Modification 2 of the present embodiment will be described with reference to FIG. 16 and FIG. 17. A structure and a method for manufacturing the semiconductor device 10 according to Modification 2 are different from those of FIG. 1 and FIG. 3 to FIG. 12. In the following description, the description of the manufacturing method common to the manufacturing method shown in FIG. 1 and FIG. 3 to FIG. 12 is omitted, and the manufacturing method relating to the difference between the two manufacturing methods will be mainly described.

Figure 16:
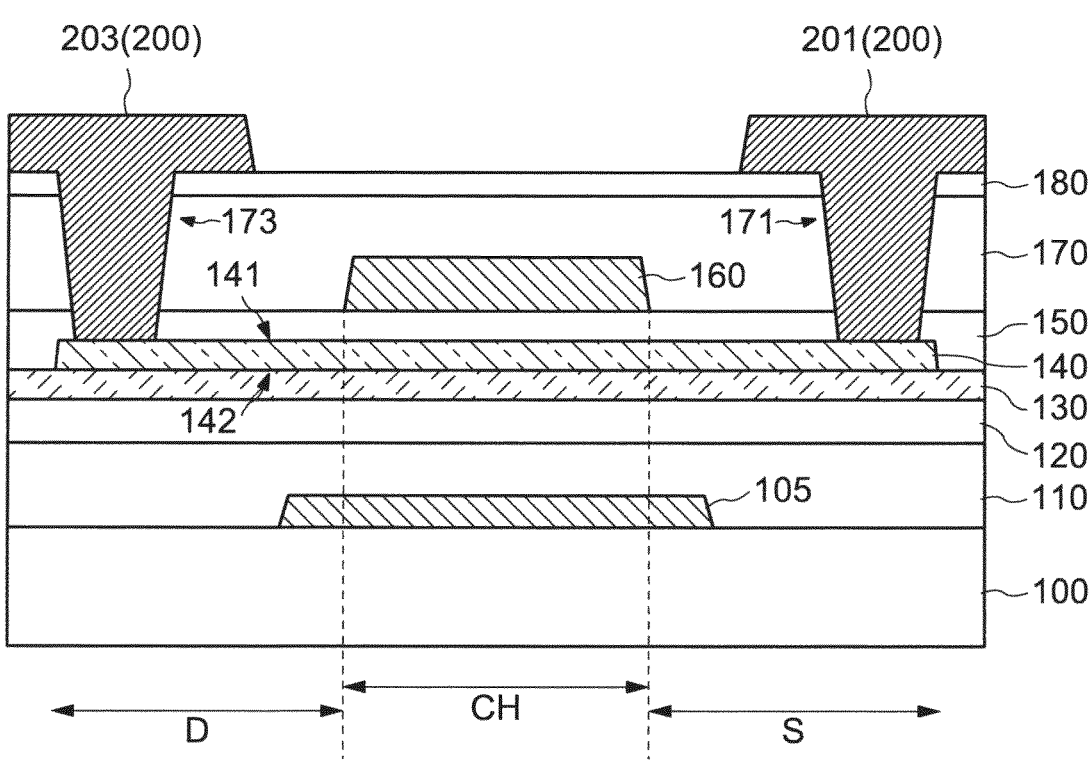
FIG. 16 is a cross-sectional view showing an outline of a semiconductor device according to a modification of an embodiment of the present invention.

FIG. 16 is a cross-sectional view showing an outline of a semiconductor device according to a modification of an embodiment of the present invention. FIG. 17 is a sequence diagram showing a method for manufacturing a semiconductor device according to a modification of the embodiment.

As shown in FIG. 16, a structure of the semiconductor device 10 according to Modification 2 is similar to the structure of the semiconductor device 10 shown in FIG. 1 but Modification 2 is different from the structure of the semiconductor device 10 shown in FIG. 1 in that the pattern of the metal oxide layer 130 is not formed. That is, in Modification 2, the metal oxide layer 130 extends outward from the pattern of the oxide semiconductor layer 140. The metal oxide layer 130 is in contact with the gate insulating layer 150 outside the patterned oxide semiconductor layer 140.

Figure 17:
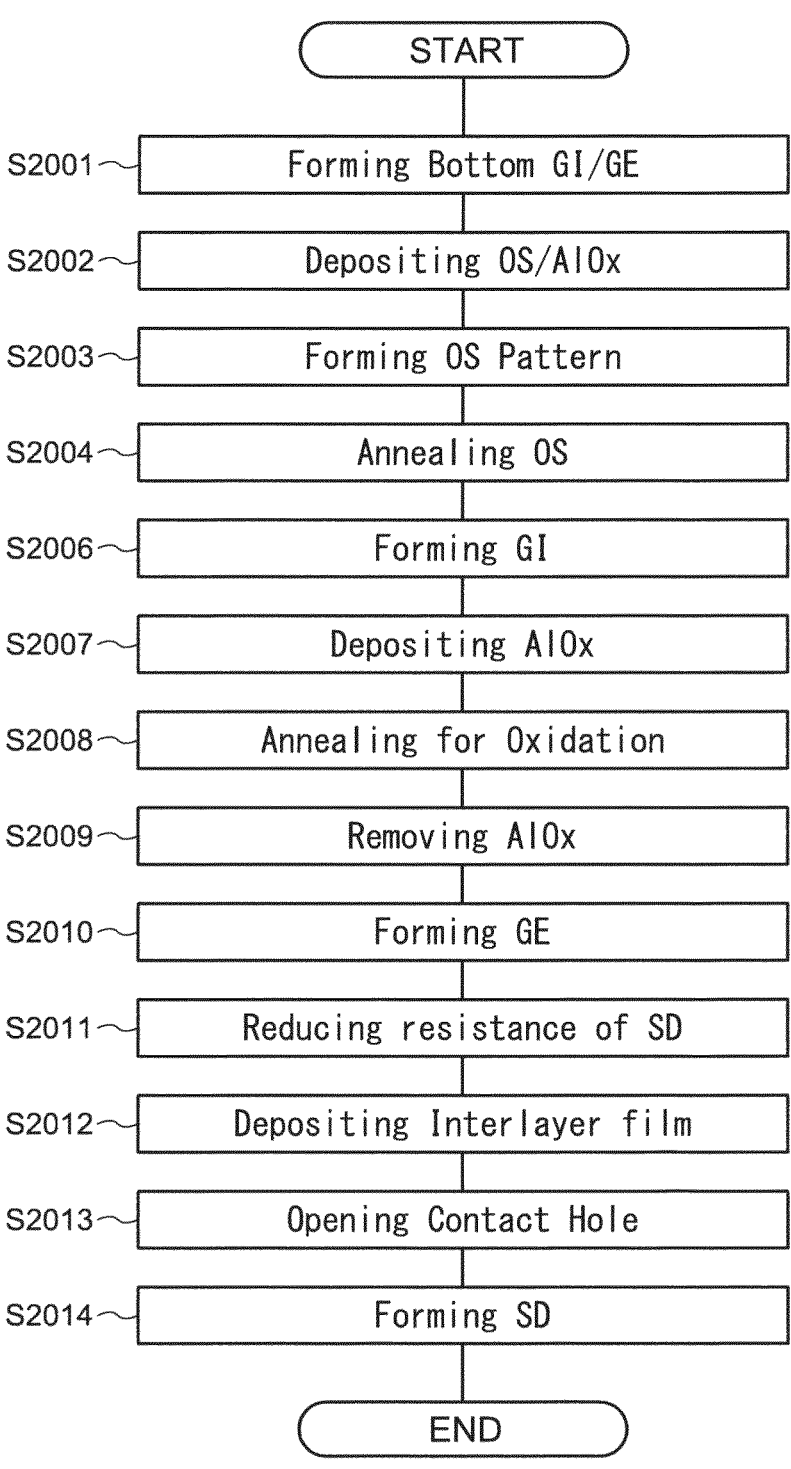
FIG. 17 is a sequence diagram showing a method for manufacturing a semiconductor device according to a modification of an embodiment of the present invention.

As shown in FIG. 17, the method for manufacturing the semiconductor device 10 according to Modification 2 is similar to the method for manufacturing the semiconductor device 10 shown in FIG. 3 but Modification 2 is different from the method for manufacturing the semiconductor device 10 shown in FIG. 3 in that the patterning formation process of the metal oxide layer 130 (step S2005 in FIG. 3) is not arranged. In other words, in Modification 2, the oxide semiconductor layer 140 formed on the metal oxide layer 130 is patterned, and the heat treatments (OS anneal and oxidation anneal) are performed on the metal oxide layer 130 and the patterned oxide semiconductor layer 140. Since the subsequent steps S2006 to S2014 are the same as those in FIG. 3, detailed descriptions thereof will be omitted.

Modification 3 of First Embodiment

Modification 3 of the present embodiment will be described with reference to FIG. 18 to FIG. 22. A structure and a method for manufacturing the semiconductor device 10 according to Modification 3 are different from those of FIG. 1 to FIG. 12. In the following description, the description of the manufacturing method common to the manufacturing method shown in FIG. 1 to FIG. 12 will be omitted, and the manufacturing method relating to the difference between the two manufacturing methods will be mainly described.

Figure 18:
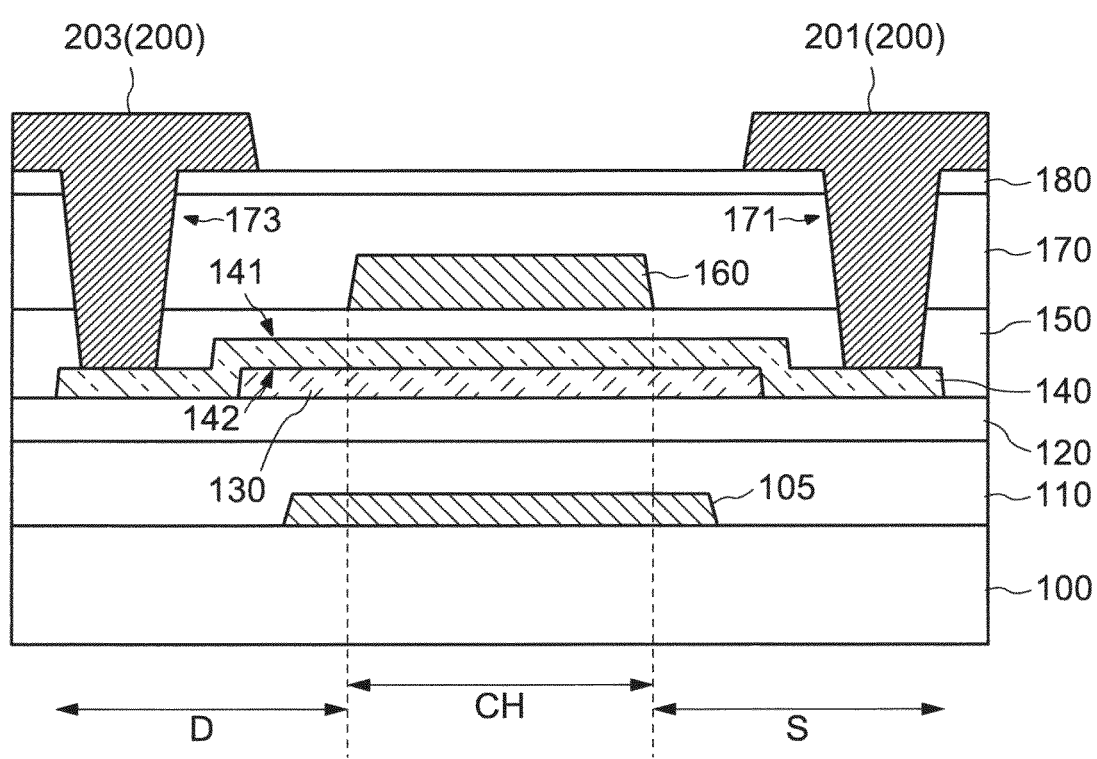
FIG. 18 is a cross-sectional view showing an outline of a semiconductor device according to a modification of an embodiment of the present invention.
Figure 19:
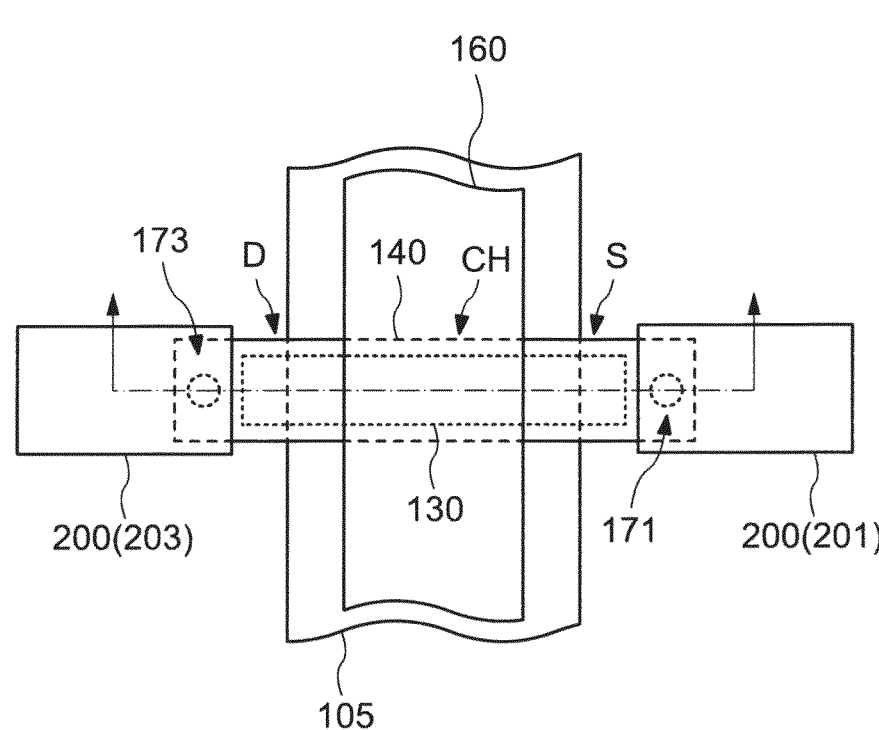
FIG. 19 is a plan view showing an outline of a semiconductor device according to a modification of an embodiment of the present invention.

FIG. 18 is a cross-sectional view showing an outline of a semiconductor device according to an embodiment of the present invention. FIG. 19 is a plan view showing an outline of a semiconductor device according to an embodiment of the present invention.

As shown in FIG. 18 and FIG. 19, the structure of the semiconductor device 10 according to Modification 3 is similar to the structure of the semiconductor device 10 shown in FIG. 1 and FIG. 2 but Modification 3 is different from the structure of the semiconductor device 10 shown in FIG. 1 in that the pattern of the metal oxide layer 130 is different from the pattern of the oxide semiconductor layer 140. Specifically, in the cross-sectional view of FIG. 18, the pattern of the oxide semiconductor layer 140 extends outward from the pattern of the metal oxide layer 130. That is, the oxide semiconductor layer 140 crosses over the pattern of the metal oxide layer 130. The oxide semiconductor layer 140 is in contact with the gate insulating layer 120 outside the pattern of the metal oxide layer 130. The gate insulating layer 120 may be referred to as a "first insulating layer."

The source-drain electrode 200 is in contact with the oxide semiconductor layer 140 in an area where the metal oxide layer 130 is not arranged. In a plan view shown in FIG. 19, the pattern of the metal oxide layer 130 is located inside the pattern of the oxide semiconductor layer 140. The openings 171 and 173 are arranged in an area not overlapping the pattern of the metal oxide layer 130.

Figure 20:
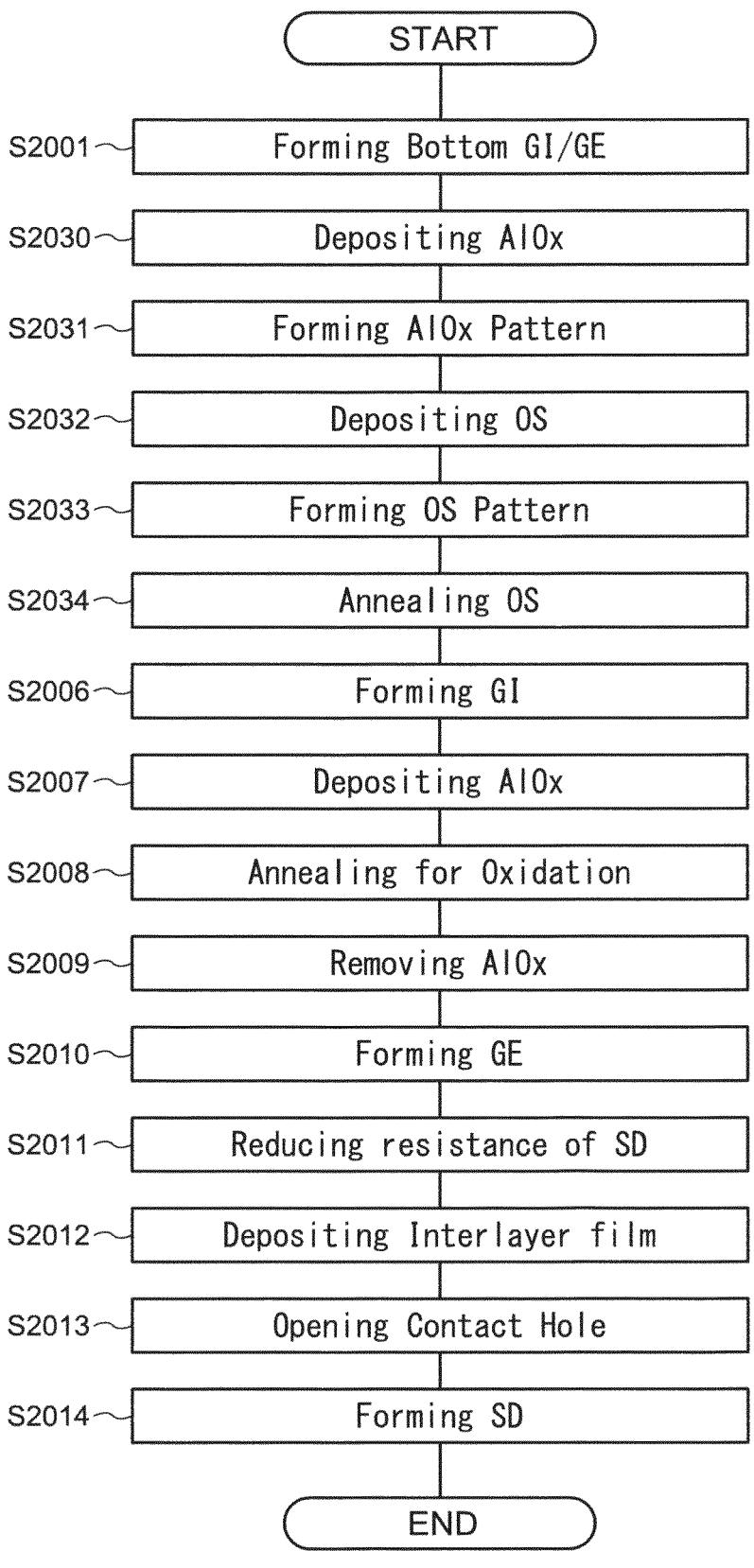
FIG. 20 is a sequence diagram showing a method for manufacturing a semiconductor device according to a modification of an embodiment of the present invention.
Figure 21:
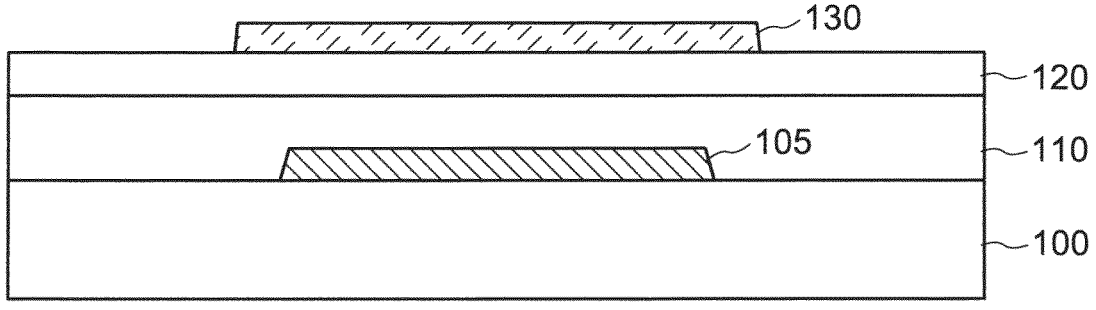
FIG. 21 is a cross-sectional view showing a method for manufacturing a semiconductor device according to a modification of an embodiment of the present invention.
Figure 22:
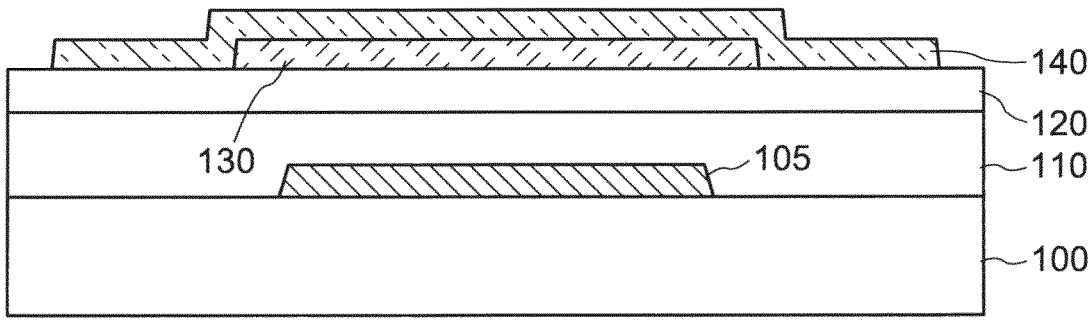
FIG. 22 is a cross-sectional view showing a method for manufacturing a semiconductor device according to a modification of an embodiment of the present invention.

FIG. 20 is a sequence diagram showing a method for manufacturing a semiconductor device according to an embodiment of the present invention. FIG. 21 and FIG. 22 are cross-sectional views showing a method for manufacturing a semiconductor device according to an embodiment of the present invention. As shown in FIG. 20, in Modification 3, the pattern of the oxide semiconductor layer 140 is formed ("Depositing OS" in step S2032 and "Forming OS Pattern" in step S2033) after the pattern of the metal oxide layer 130 is formed ("Depositing AlO$_x$" in step S2030 and "Forming AlO$_x$ Pattern" in step S2031). Unlike FIG. 3, the OS anneal ("Annealing OS" in step S2034) is performed after the pattern of the metal oxide layer 130 is formed. In other words, the oxide semiconductor layer 140 is deposited and patterned after the metal oxide layer 130 is patterned. Then, the heat treatments (OS anneal and oxidation anneal)

are performed on the patterned oxide semiconductor layer 140 and the metal oxide layer 130.

As shown in FIG. 21, the metal oxide layer 130 is formed on the gate insulating layer 120 (step S2030), and the pattern of the metal oxide layer 130 is formed (step S2031). Patterning (etching) of the metal oxide layer 130 is performed in the same manner as described above.

As shown in FIG. 22, the oxide semiconductor layer 140 is deposited on the patterned metal oxide layer 130 (step S2032), and the pattern of the oxide semiconductor layer 140 is formed (step S2033). Patterning (etching) of the oxide semiconductor layer 140 is performed in the same manner as described above. Then, the OS anneal is performed in a state as shown in FIG. 22 (step S2034). Since the subsequent steps S2006 to S2012 are the same as those in FIG. 3, detailed descriptions thereof will be omitted.

As described above, in the semiconductor device 10 according to Modifications 1 to 3 of the present embodiment, it is possible to obtain the same effects as those of the present embodiment.

Second Embodiment

A display device using a semiconductor device according to an embodiment of the present invention will be described with reference to FIG. 23 to FIG. 27. In the embodiment shown below, a configuration in which the semiconductor device 10 described in the first embodiment described above is applied to the circuit of the liquid crystal display device will be described.

[Outline of Display Device 20]

Figure 23:
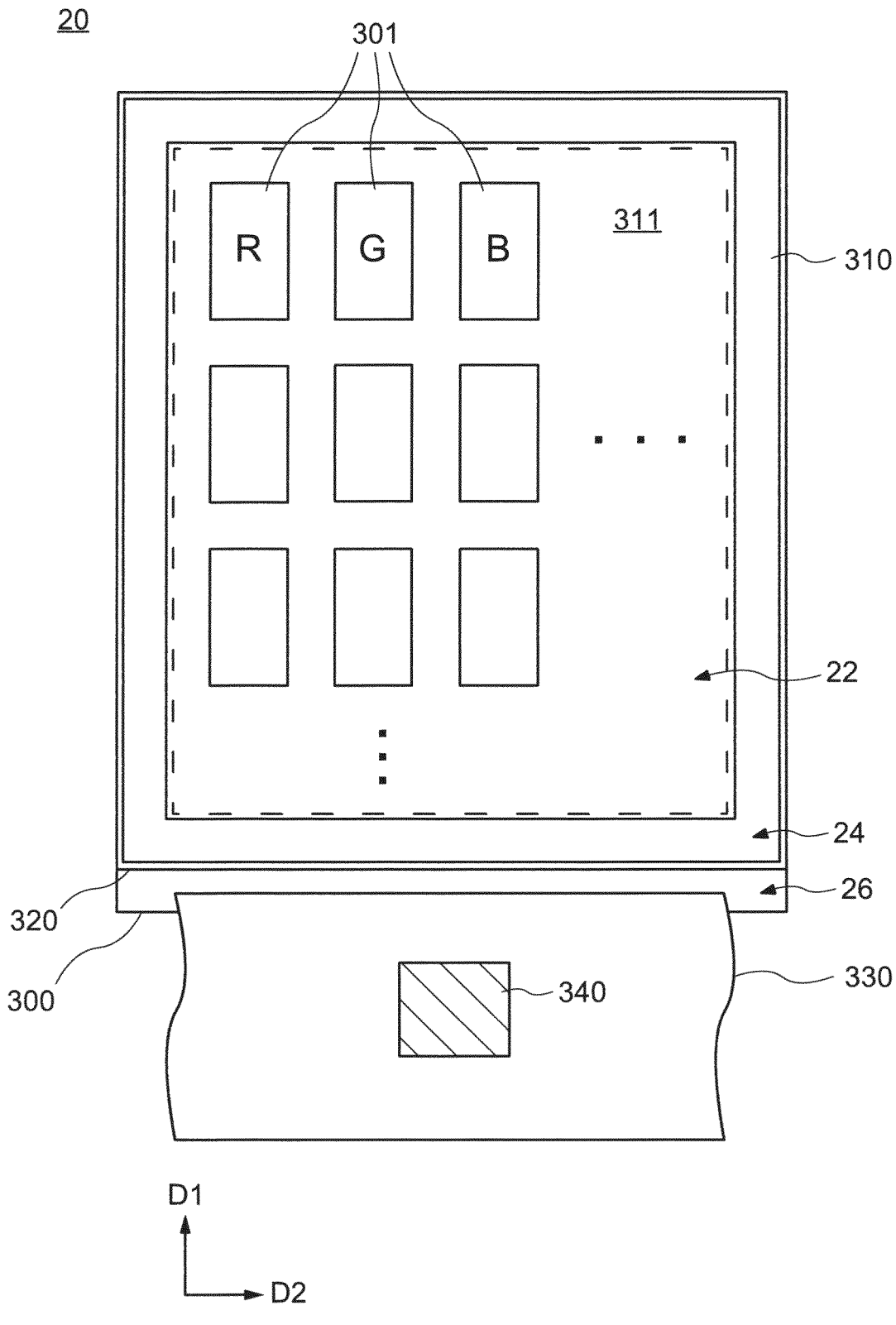
FIG. 23 is a plan view showing an outline of a display device according to an embodiment of the present invention.

FIG. 23 is a plan view showing an outline of a display device according to an embodiment of the present invention. As is shown in FIG. 23, the display device 20 includes an array substrate 300, a seal portion 310, a counter substrate 320, a flexible printed circuit substrate 330 (FPC 330), and an IC chip 340. The array substrate 300 and the counter substrate 320 are bonded together by the seal portion 310. A plurality of pixel circuits 301 is arranged in a matrix in a liquid crystal area 22 surrounded by the seal portion 310. The liquid crystal area 22 is an area overlapping a liquid crystal element 311, which will be described later, in a plan view.

A seal area 24 where the seal portion 310 is arranged is an area surrounding the liquid crystal area 22. The FPC 330 is arranged in a terminal area 26. The terminal area 26 is an area where the array substrate 300 is exposed from the counter substrate 320 and is arranged outside the seal area 24. Outside the seal area 24 means areas outside the area where the seal portion 310 is arranged and the area surrounded by the seal portion 310. The IC chip 340 is arranged on the FPC 330. The IC chip 340 supplies a signal for driving each pixel circuit 301.

[Circuit Configuration of Display Device 20]

Figure 24:
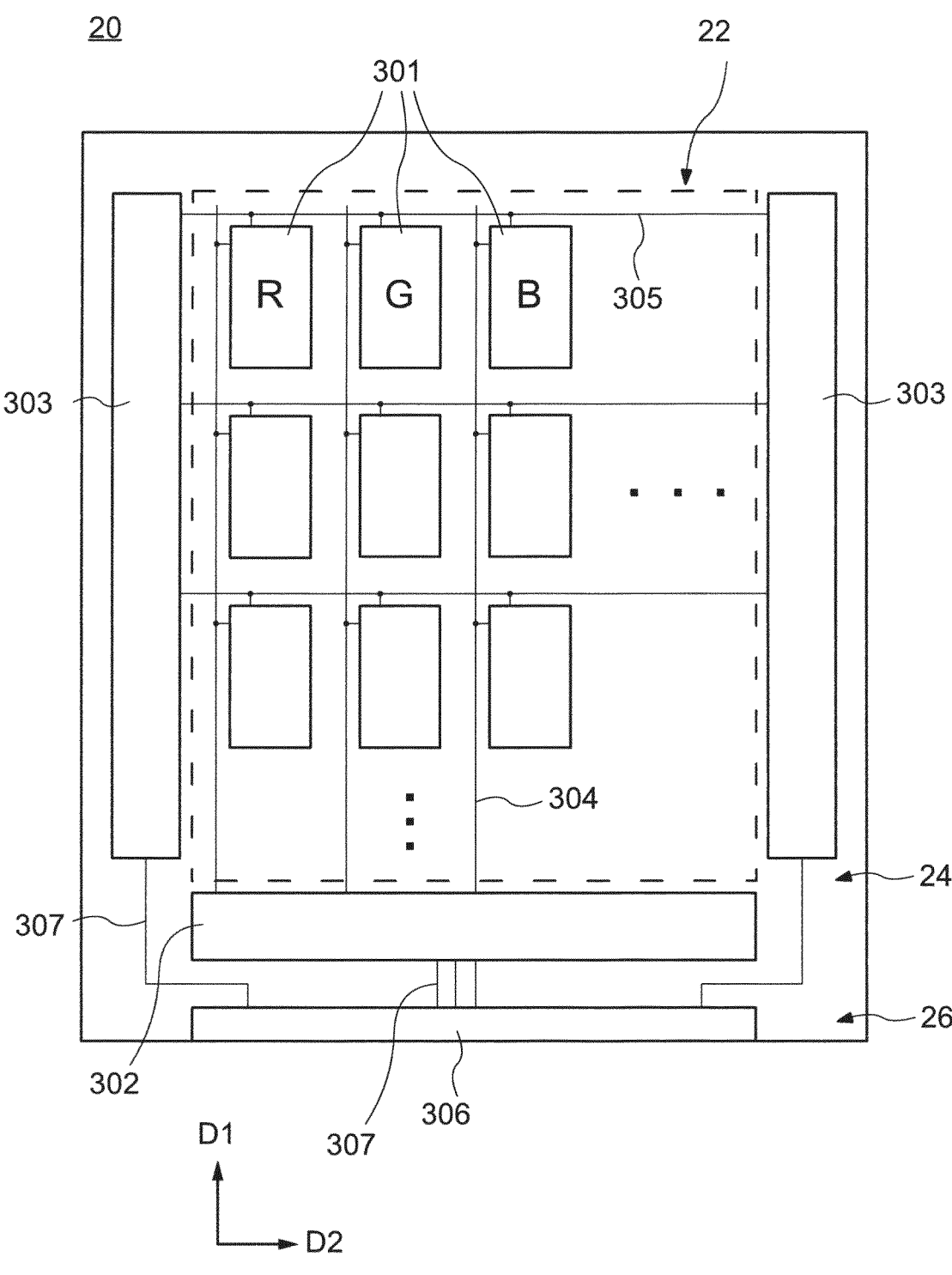
FIG. 24 is a block diagram showing a circuit configuration of a display device according to an embodiment of the present invention.

FIG. 24 is a block diagram showing a circuit configuration of a display device according to an embodiment of the present invention. As is shown in FIG. 24, a source driver circuit 302 is arranged at a position adjacent to the liquid crystal area 22 where the pixel circuit 301 is arranged in the direction D1 (column direction), and a gate driver circuit 303 is arranged at a position adjacent to the liquid crystal area 22 in the direction D2 (row direction). The source driver circuit 302 and the gate driver circuit 303 are arranged in the seal area 24 described above. However, the area where the source driver circuit 302 and the gate driver circuit 303 are arranged is not limited to the seal area 24. The source driver circuit 302 and the gate driver circuit 303 may be arranged in any area outside the area where the pixel circuit 301 is arranged.

A source wiring 304 extends from the source driver circuit 302 in the direction D1 and is connected to the plurality of pixel circuits 301 arranged in the direction D1. A gate wiring 305 extends from the gate driver circuit 303 in the direction D2 and is connected to the plurality of pixel circuits 301 arranged in the direction D2.

A terminal portion 306 is arranged in the terminal area 26. The terminal portion 306 and the source driver circuit 302 are connected by a connection wiring 307. Similarly, the terminal portion 306 and the gate driver circuit 303 are connected by the connection wiring 307. By connecting the FPC 330 to the terminal portion 306, an external device which is connected to the FPC 330 and the display device 20 are connected, and a signal from the external device drives each pixel circuit 301 arranged in the display device 20.

The semiconductor device 10 shown in the first embodiment is used as a transistor included in the pixel circuit 301, the source driver circuit 302, and the gate driver circuit 303.

[Pixel Circuit 301 of Display Device 20]

Figure 25:
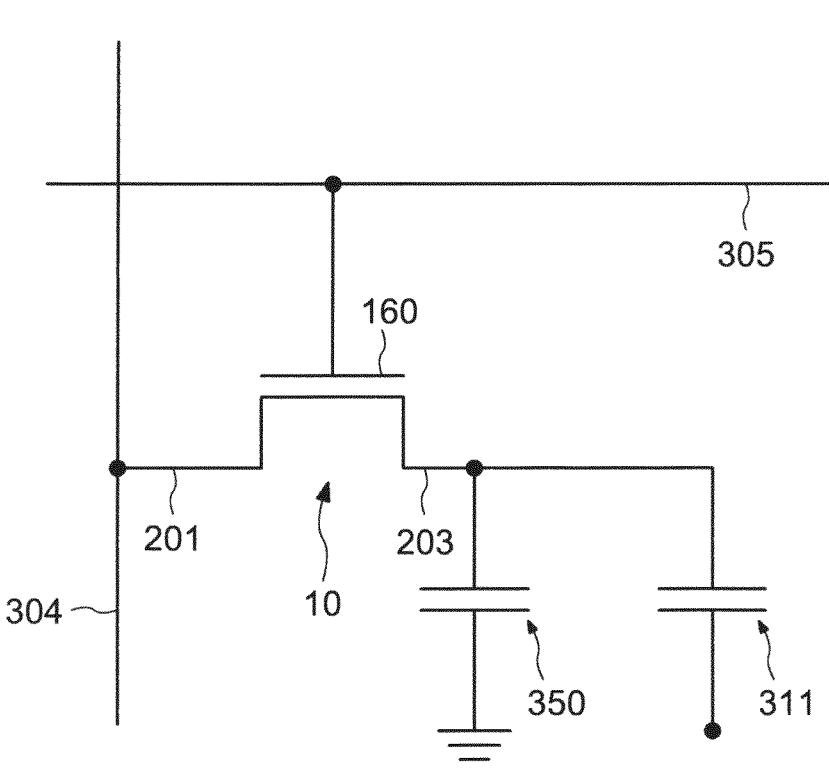
FIG. 25 is a circuit diagram showing a pixel circuit of a display device according to an embodiment of the present invention.

FIG. 25 is a circuit diagram showing a pixel circuit of a display device according to an embodiment of the present invention. As is shown in FIG. 25, the pixel circuit 301 includes elements such as the semiconductor device 10, a storage capacitor 350, and the liquid crystal element 311. The semiconductor device 10 has the gate electrode 160, the source electrode 201, and the drain electrode 203. The gate electrode 160 is connected to the gate wiring 305. The source electrode 201 is connected to the source wiring 304. The drain electrode 203 is connected to the storage capacitor 350 and the liquid crystal element 311. In the present embodiment, although an electrode indicated by 201 is referred to as a source electrode and an electrode indicated by 203 is referred to as a drain electrode for the convenience of explanation, the electrode indicated by 201 may function as a drain electrode and the electrode indicated by 203 may function as a source electrode.

[Cross-Section of Display Device 20]

Figure 26:
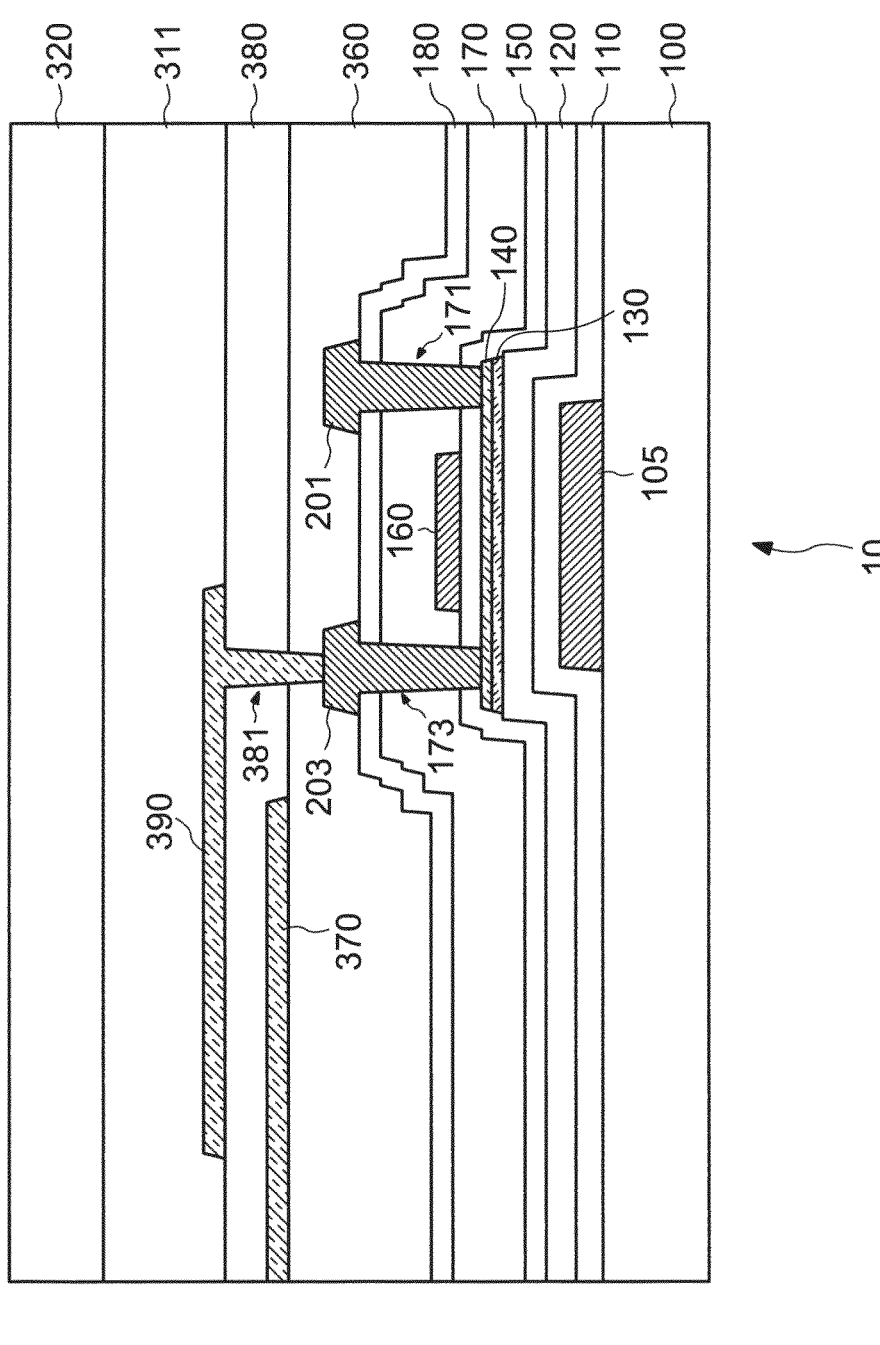
FIG. 26 is a cross-sectional view showing an outline of a display device according to an embodiment of the present invention.

FIG. 26 is a cross-sectional view of a display device according to an embodiment of the present invention. As shown in FIG. 26, the display device 20 is a display device in which the semiconductor device 10 is used. In the present embodiment, although a configuration in which the semiconductor device 10 is used for the pixel circuit 301 is exemplified, the semiconductor device 10 may be used for a peripheral circuit including the source driver circuit 302 and the gate driver circuit 303. In the following description, since the configuration of the semiconductor device 10 is the same as that of the semiconductor device 10 shown in FIG. 1, the description thereof will be omitted.

An insulating layer 360 is arranged on the source electrode 201 and the drain electrode 203. A common electrode 370 arranged in common for the plurality of pixels is arranged on the insulating layer 360. An insulating layer 380 is arranged on the common electrode 370. An opening 381 is arranged in the insulating layers 360 and 380. A pixel electrode 390 is arranged on the insulating layer 380 and within the opening 381. The pixel electrode 390 is connected to the drain electrode 203.

Figure 27:
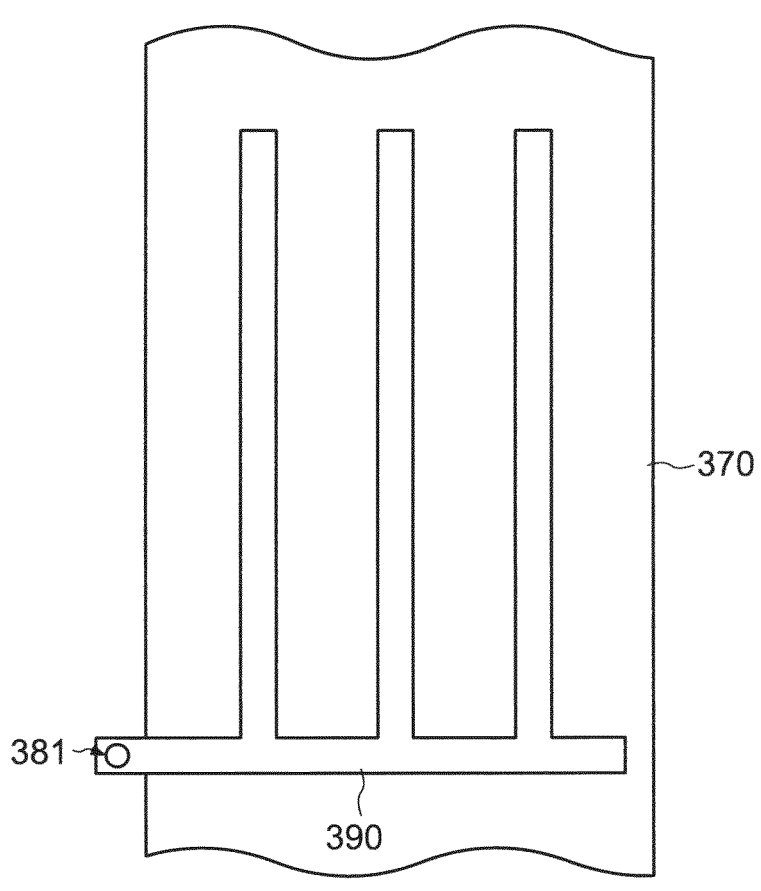
FIG. 27 is a plan view of a pixel electrode and a common electrode of a display device according to an embodiment of the present invention.
Figure 27:
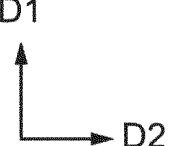

FIG. 27 is a plan view of a pixel electrode and a common electrode of a display device according to an embodiment of the present invention. As shown in FIG. 27, the common electrode 370 has an overlapping area overlapping the pixel electrode 390 in a plan view, and a non-overlapping area not overlapping the pixel electrode 390. When a voltage is supplied between the pixel electrode 390 and the common electrode 370, a horizontal electric field is formed from the pixel electrode 390 in the overlapping area toward the common electrode 370 in the non-overlapping area. The gradation of the pixel is determined by the operation of liquid crystal molecules included in the liquid crystal element 311 by the horizontal electric field.

Third Embodiment

A display device using a semiconductor device according to an embodiment of the present invention will be explained with reference to FIG. 28 and FIG. 29. In the present embodiment, a configuration in which the semiconductor device 10 explained in the first embodiment is applied to a circuit of an organic EL display device will be described. Since the outline and the circuit configuration of the display device 20 are the same as those shown in FIG. 23 and FIG. 24, the description thereof will be omitted.

[Pixel Circuit 301 of Display Device 20]

Figure 28:
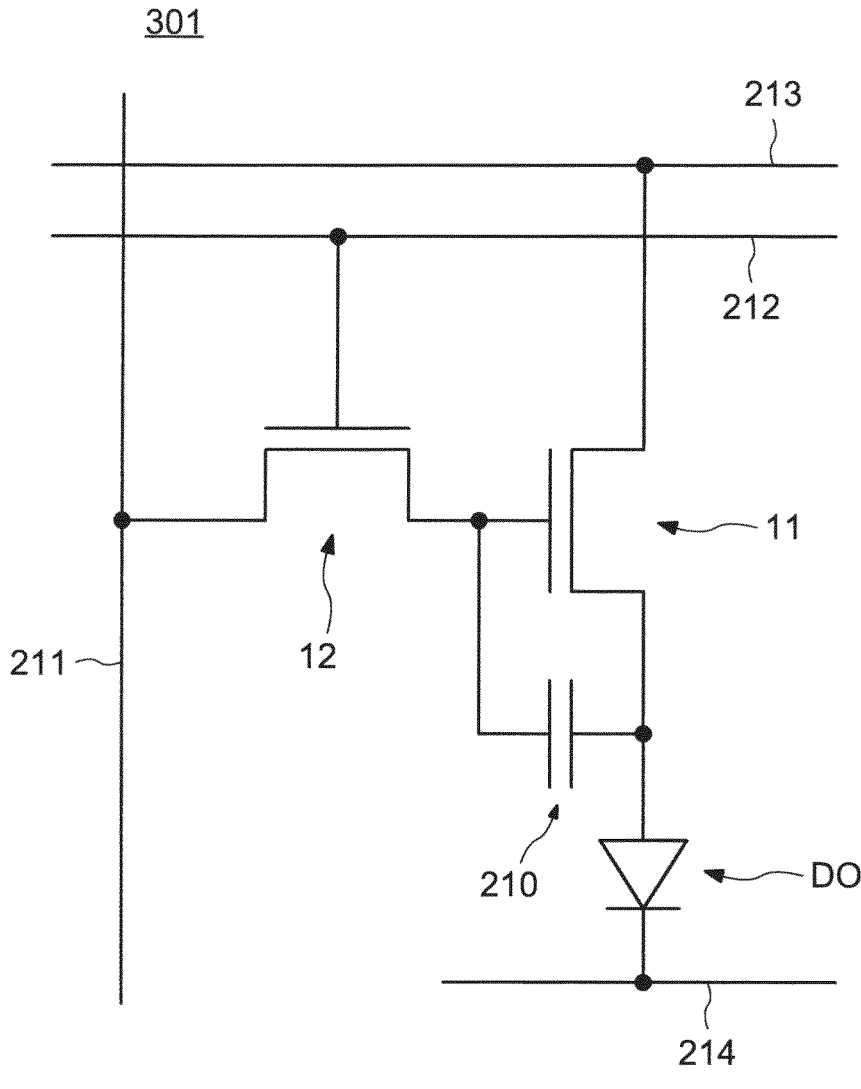
FIG. 28 is a circuit diagram showing a pixel circuit of a display device according to an embodiment of the present invention.

FIG. 28 is a circuit diagram showing a pixel circuit of a display device according to an embodiment of the present invention. As shown in FIG. 28, the pixel circuit 301 includes elements such as a drive transistor 11, a selection transistor 12, a storage capacitor 210, and a light-emitting element DO. The drive transistor 11 and the selection transistor 12 have the same configuration as the semiconductor device 10. The source electrode of the selection transistor 12 is connected to a signal line 211, and the gate electrode of the selection transistor 12 is connected to a gate line 212. The source electrode of the drive transistor 11 is connected to an anode power line 213, and the drain electrode of the drive transistor 11 is connected to one end of the light-emitting element DO. The other end of the light-emitting element DO is connected to a cathode power line 214. The gate electrode of the drive transistor 11 is connected to the drain electrode of the selection transistor 12. The storage capacitor 210 is connected to the gate electrode and the drain electrode of the drive transistor 11. A gradation signal for determining the light-emitting intensity of the light-emitting element DO is supplied to the signal line 211. A signal for selecting a pixel row in which the gradation signal described above is written is supplied to the gate line 212.

[Cross-Sectional Structure of Display Device 20]

Figure 29:
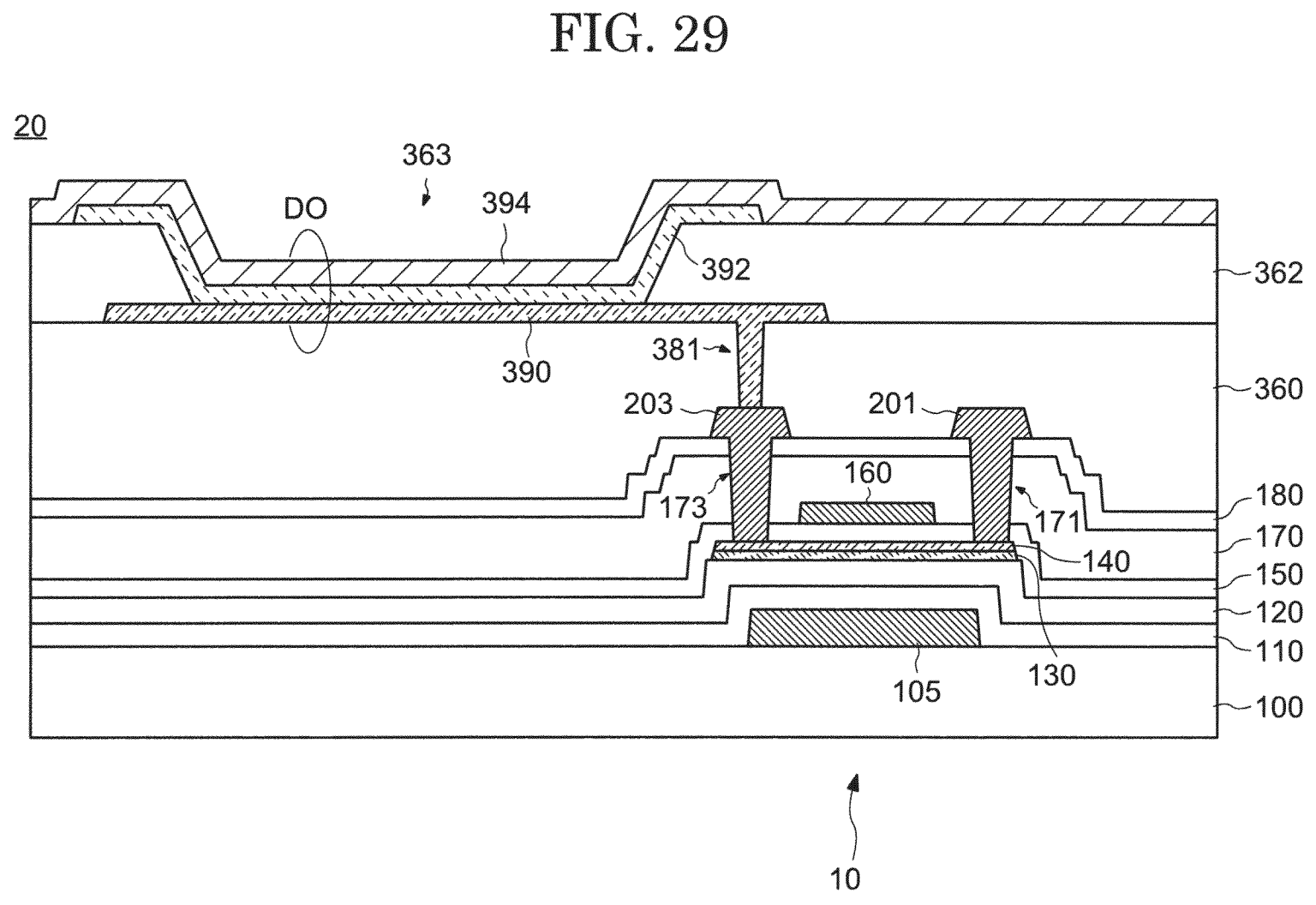

FIG. 29 is a cross-sectional diagram of a display device according to an embodiment of the present invention. Although the configuration of the display device 20 shown in FIG. 29 is similar to the display device 20 shown in FIG. 26, the configuration above the insulating layer 360 of the display device 20 in FIG. 29 is different from the structure above the insulating layer 360 of the display device 20 in FIG. 26. Hereinafter, in the configuration of the display device 20 in FIG. 29, descriptions of the same configuration as the display device 20 in FIG. 26 are omitted, and differences between the two will be explained.

As shown in FIG. 29, the display device 20 has the pixel electrode 390, a light-emitting layer 392, and a common electrode 394 (the light-emitting element DO) above the insulating layer 360. The pixel electrode 390 is arranged above the insulating layer 360 and inside the opening 381. An insulating layer 362 is arranged above the pixel electrode 390. An opening 363 is arranged in the insulating layer 362. The opening 363 corresponds to a light-emitting area. That is, the insulating layer 362 defines a pixel. The light-emitting layer 392 and the common electrode 394 are arranged above the pixel electrode 390 exposed by the opening 363. The pixel electrode 390 and the light-emitting layer 392 are individually arranged for each pixel. On the other hand, the common electrode 394 is arranged in common for the plurality of pixels. Different materials are used for the light-emitting layer 392 depending on the display color of the pixel.

In the second embodiment and third embodiment, although the configuration in which the semiconductor device explained in the first embodiment was applied to a liquid crystal display device and an organic EL display device was exemplified, the semiconductor device may be applied to display devices (for example, a self-luminous display device or an electronic paper display device other than an organic EL display device) other than these display devices. In addition, the semiconductor device described above can be applied without any particular limitation from a small sized display device to a large sized display device.

EXAMPLES

[Electrical Characteristics of Semiconductor Device 10]

The electrical characteristics of the semiconductor device 10 according to the embodiment will be described with reference to FIG. 30 and FIG. 31. The electrical characteristics shown in FIG. 30 and FIG. 31 are the electrical characteristics of the semiconductor device 10 shown in the first embodiment.

[Initial Characteristics]

Figure 30:
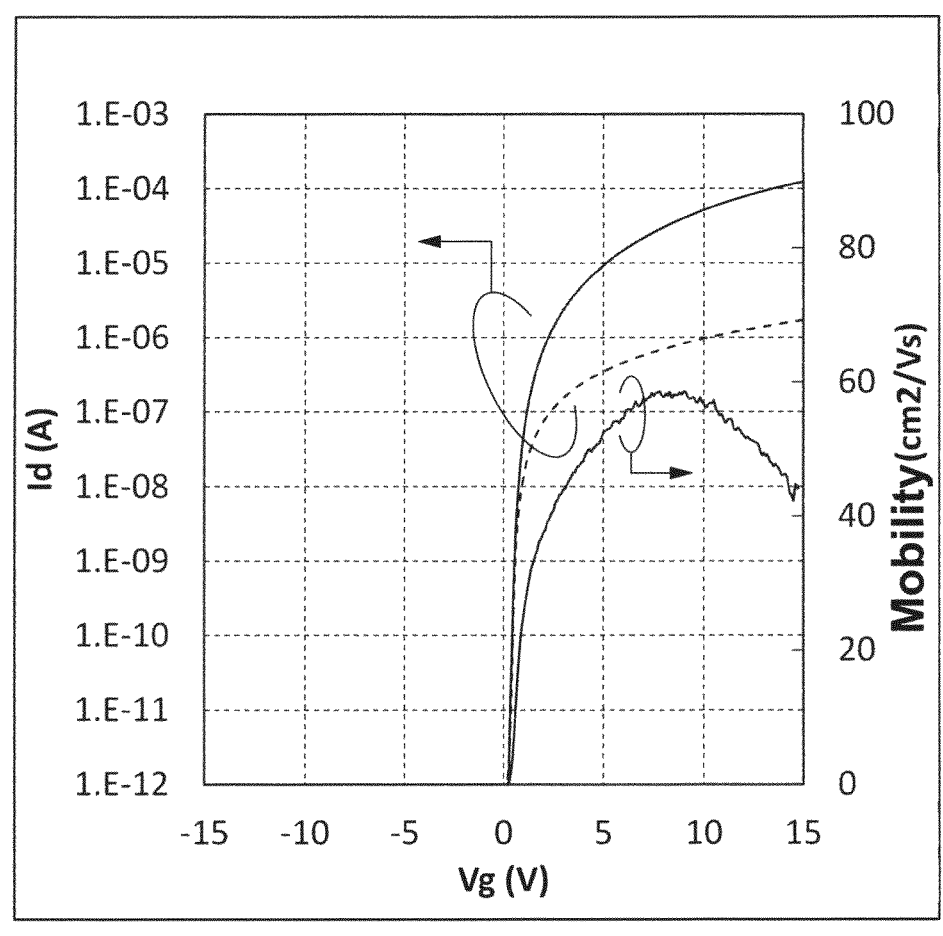
FIG. 30 is a diagram showing the electrical characteristics of a semiconductor device according to an embodiment of the present invention.
Figure 31:
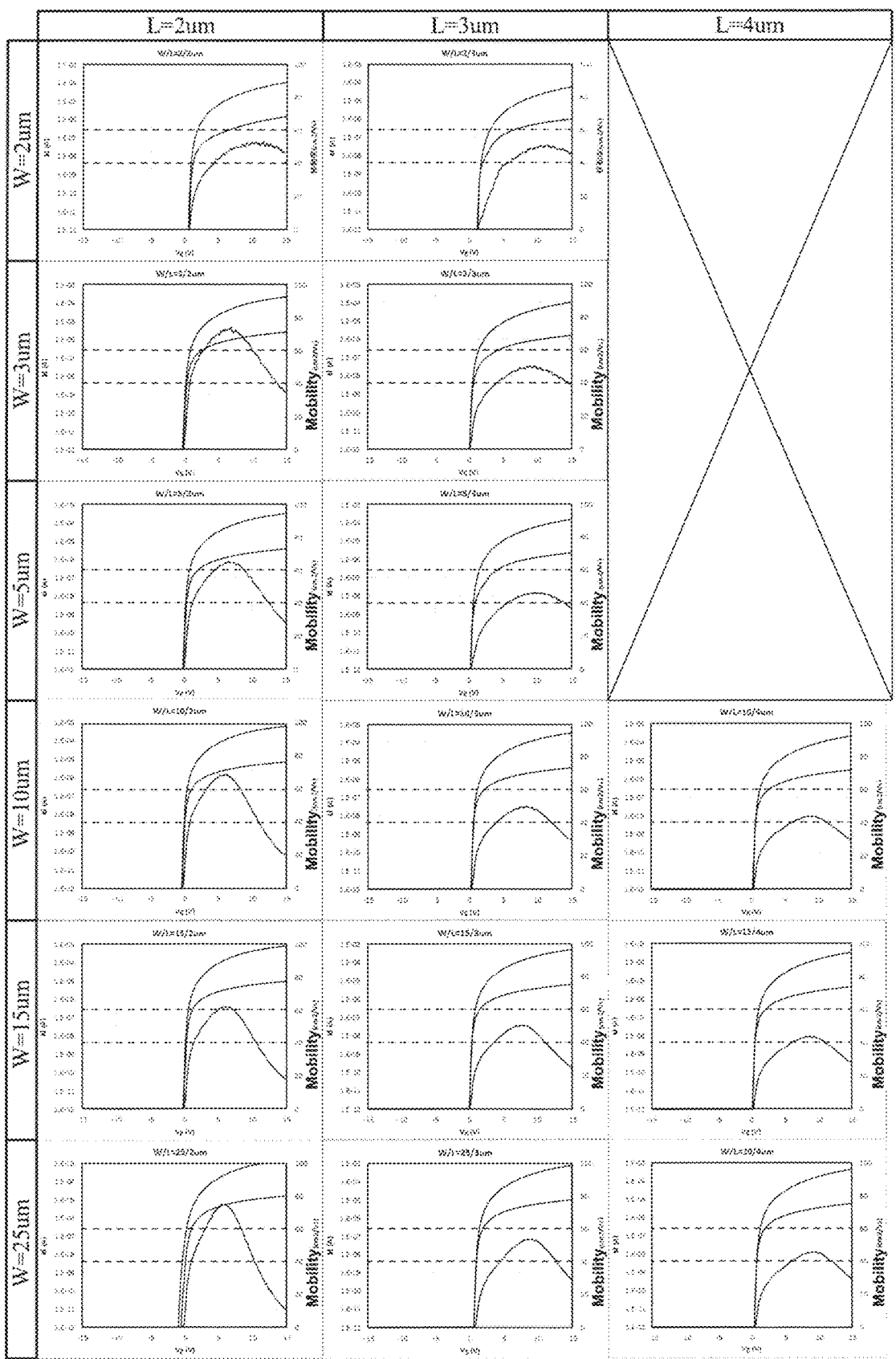
FIG. 31 is a diagram showing the electrical characteristics of a semiconductor device according to an embodiment of the present invention.

The measurement conditions for the electrical characteristics shown in FIG. 30 and FIG. 31 are as follows.

Size of the channel area CH: W/L=3.0 μm/3.0 μm

Source and drain voltage: 0.1 V (dotted line), 10 V (solid line)

Gate voltage: −15 V to +15 V

Measurement environment: room temperature, dark room

The electrical characteristics (Id-Vg characteristics) and mobility of the semiconductor device 10 are shown in FIG. 30 and FIG. 31. As indicated by arrows in the graphs of FIG. 30 and FIG. 31, the vertical axis for a drain current (Id) is shown on the left side of the graph, and the vertical axis for the mobility calculated from the drain current is shown on the right side of the graph.

As shown in FIG. 30, the electrical characteristics of the semiconductor device 10 according to the first embodiment exhibit so-called normally-off characteristics in which the drain current Id begins to flow when the gate voltage Vg is higher than 0 V. The mobility calculated from the electrical characteristics is about 59 [cm²/Vs].

FIG. 31 shows the dependence of the channel length L and the channel width W in the electrical characteristics of the semiconductor device 10 according to the first embodiment. In FIG. 31, the electrical characteristics when the channel length is 2 μm to 4 μm and the channel width is 2 μm to 25 μm are shown. As shown in FIG. 31, it was confirmed that it is possible to obtain good electrical characteristics even when the channel length was 2 μm and the channel width was 2 μm and even when the channel length was 4 μm and the channel width was 25 μm. In each graph in FIG. 31, horizontal dotted lines are drawn at values for the mobility of 40 [cm²/Vs] and 60 [cm²/Vs]. Mobility of 40 [cm²/Vs] or more is realized in the semiconductor device 10 of all sizes shown in FIG. 31, and mobility of 60 [cm²/Vs] or more is realized in the semiconductor device 10 of some sizes.

[Reliability Test]

Figure 32:
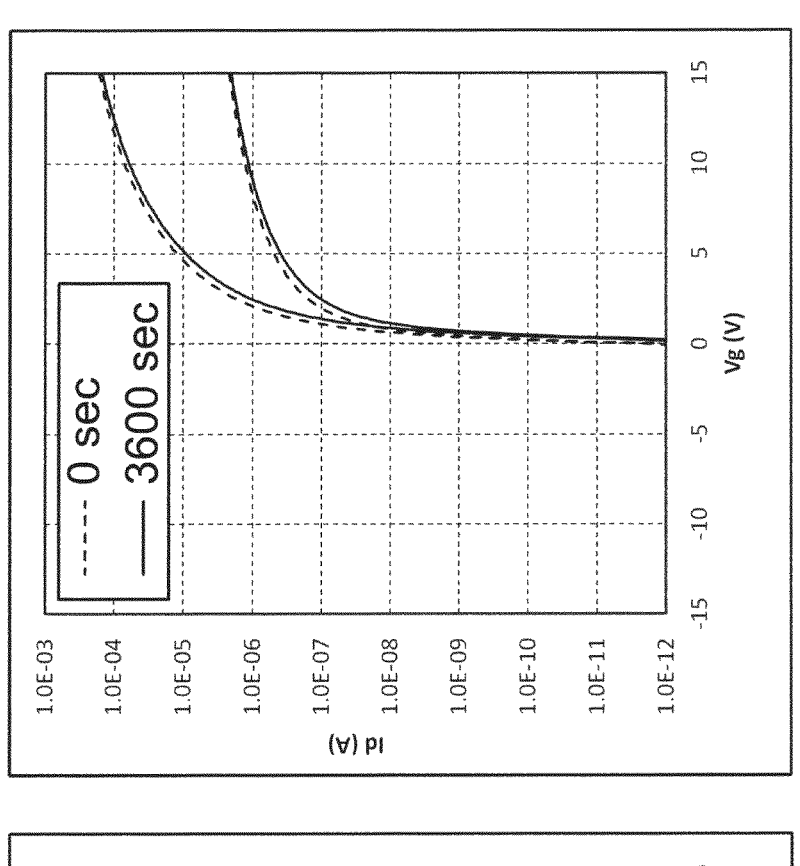
FIG. 32 is a diagram showing a reliability test result of a semiconductor device according to an embodiment of the present invention.
Figure 32:
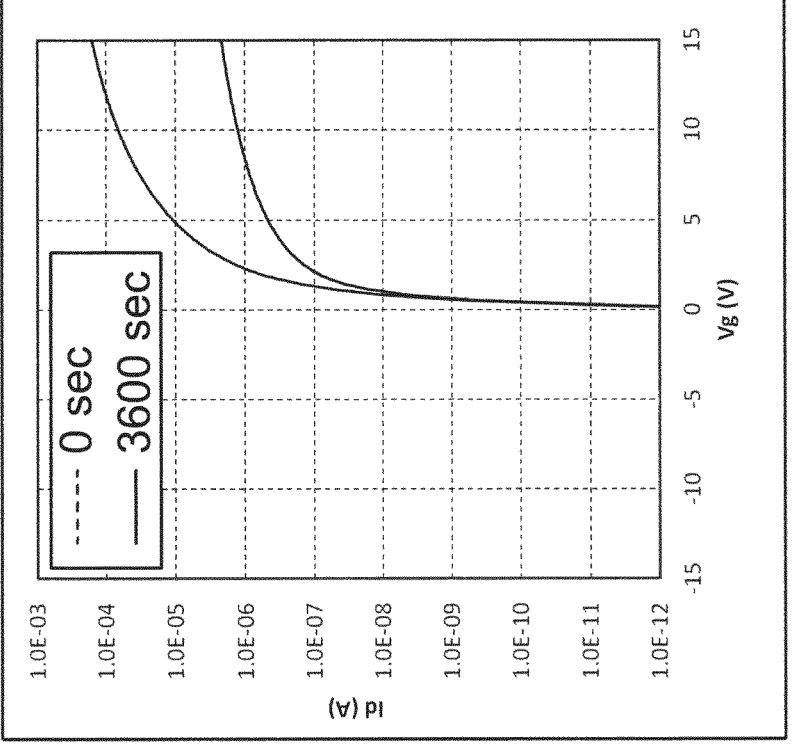

FIG. 32 is a diagram showing a reliability test result of a semiconductor device according to an embodiment of the present invention. FIG. 32 shows an evaluation result of reliability by Positive Bias Temperature Stress (PBTS) and an evaluation result of reliability by Negative Bias Temperature Illumination Stress (NBTIS). The reliability test result shown in FIG. 32 is the result of the semiconductor device 10 shown in the first embodiment.

Conditions for the PBTS reliability test are as follows.
Size of the channle area CH: W/L=3.0 μm/3.0 μm
Light irradiation condition: No irradiation (dark room)
Gate voltage: +30 V
Source and drain voltage: 0 V
Stage temperature at stress application: 60° C.
Conditions for the NBTIS reliability test are as follows.
Size of the channle area CH: W/L=3.0 μm/3.0 μm
Irradiation condition: Irradiation present (8000 cd/m$^2$)
Gate voltage: −30 V
Source and drain voltage: 0 V
Stage temperature at stress application: 60° C.

As shown in FIG. 32, the evaluation results of the electrical characteristics of a semiconductor device before the application of stress (0 sec) and after the application of stress (3600 sec) are respectively displayed by overlapping each other. In FIG. 32, the electrical characteristics before stress application (0 sec) are indicated by dotted lines, and the electrical characteristics after stress application (3600 sec) are indicated by solid lines.

The measurement conditions for the electrical characteristics of the semiconductor device 10 before and after stress application are as follows.

Source and drain voltage: 0.1 V, 10 V
Gate voltage: −15 V to +15 V
Measurement environment: 60° C., dark room As shown in FIG. 32, in the semiconductor device 10 according to the first embodiment, the electrical characteristics are almost unchanged in both the NBTIS test and PBTS test.

[Influence of Sputtering Method on Electrical Characteristics of Semiconductor Device 10]

Figure 33:
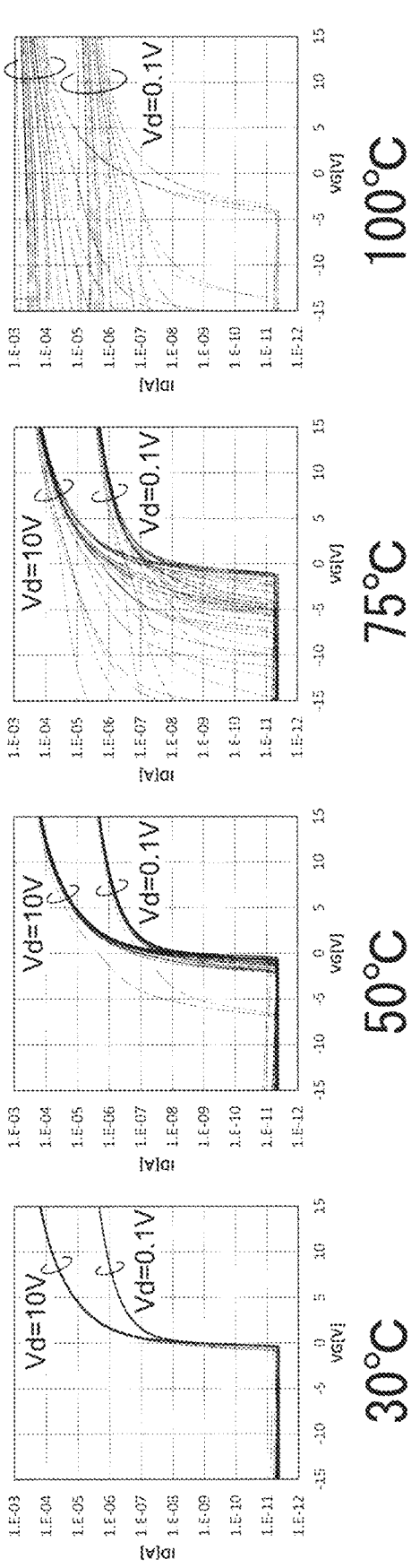
FIG. 33 is a diagram showing the electrical characteristics of a semiconductor device according to an embodiment of the present invention.

The dependence of the electrical characteristics of the semiconductor device 10 similar to the first embodiment on the deposition conditions of the oxide semiconductor layer 140 is shown with reference to FIG. 33. FIG. 33 is a diagram showing the electrical characteristics of a semiconductor device according to an embodiment of the present invention. In the method for manufacturing the semiconductor device 10 shown in FIG. 33 for which the electrical characteristics were measured, the conditions except for the deposition temperature of the oxide semiconductor layer 140 are all the same. As shown in FIG. 33, the lower the deposition temperature of the oxide semiconductor layer 140, the better the electrical characteristics of the semiconductor device 10. It is considered that the oxide semiconductor layer 140 in a state of low crystalline components could be formed by forming the oxide semiconductor layer 140 while cooling the object to be deposited, and it is considered that a good crystalline state of the oxide semiconductor layer 140 was obtained by the subsequent OS anneal.

Each of the embodiments described above as an embodiment of the present invention can be appropriately combined and implemented as long as no contradiction is caused. In addition, the addition, deletion, or design change of components, or the addition, deletion, or condition change of processes as appropriate by those skilled in the art based on a semiconductor device and a display device of each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A method for manufacturing a semiconductor device comprising:
forming a first metal oxide layer containing aluminum as a main component above a substrate;
forming an oxide semiconductor layer above the first metal oxide layer;
forming a gate insulating layer above the oxide semiconductor layer;
forming a second metal oxide layer containing aluminum as a main component above the gate insulating layer so as to be in contact with a top surface of the gate insulating layer;
performing a heat treatment in a state where the second metal oxide layer is formed above the gate insulating layer;
removing the second metal oxide layer after the heat treatment; and
forming a gate electrode above the gate insulating layer so as to be in contact with the top surface of the gate insulating layer.

2. The method according to claim 1, wherein
the gate electrode is formed to be in contact with the gate insulating layer exposed by removing the second metal oxide layer.

3. The method according to claim 1, further comprising
forming a first insulating layer above the substrate,
wherein the first metal oxide layer is formed above the first insulating layer.

4. The method according to claim 1, wherein
the oxide semiconductor layer is formed to be in contact with the first metal oxide layer.

5. The method according to claim 1, wherein
the removal of the second metal oxide layer is performed without using a mask.

6. The method according to claim 1, wherein
the first metal oxide layer is formed by a sputtering method.

7. The method according to claim 1, wherein
the second metal oxide layer is formed by a sputtering method.

8. The method according to claim 1, wherein
the oxide semiconductor layer is formed by a sputtering method while cooling the substrate.

9. The method according to claim 1, wherein
the oxide semiconductor layer is formed by a sputtering method while cooling the substrate so that a temperature of a surface of the substrate is 50° C. or less.

10. The method according to claim 1 further comprising:
patterning the oxide semiconductor layer formed above the first metal oxide layer; and
performing the heat treatment on the first metal oxide layer and the patterned oxide semiconductor layer.

11. The method according to claim 1 further comprising:
patterning the oxide semiconductor layer and the first metal oxide layer; and
performing the heat treatment on the patterned oxide semiconductor layer and the first metal oxide layer.

12. The method according to claim 1 further comprising:
patterning the oxide semiconductor layer;
patterning the first metal oxide layer using the patterned oxide semiconductor layer as a mask; and performing the heat treatment on the patterned oxide semiconductor layer and the first metal oxide layer.

13. The method according to claim 1 further comprising:

patterning the first metal oxide layer before depositing the oxide semiconductor layer;

depositing the oxide semiconductor layer after the first metal oxide layer is patterned;

patterning the oxide semiconductor layer, and performing the heat treatment on the patterned oxide semiconductor layer and the first metal oxide layer.

14. The method according to claim 1, wherein all of the second metal oxide layer in an area overlapping at least the oxide semiconductor layer in a plan view is removed in one independent pattern of the oxide semiconductor layer.

15. The method according to claim 1, wherein a field-effect mobility of the semiconductor device obtained by the method is 50 $[cm^2/Vs]$ or more.

16. A method for manufacturing semiconductor device comprising:

forming a gate electrode above a substrate;

forming a gate insulating layer above the gate electrode;

forming a first metal oxide layer containing aluminum as a main component above the gate insulating layer;

forming a oxide semiconductor layer above the first metal oxide layer;

forming a first insulating layer above the oxide semiconductor layer;

forming a second metal oxide layer containing aluminum as a main component above the first insulating layer;

performing a heat treatment in a state where the second metal oxide layer is formed above the first insulating layer; and removing the second metal oxide layer in all areas overlapping a pattern of the oxide semiconductor layer in a plan view after the heat treatment.

17. The method according to claim 16, wherein the removal of the second metal oxide layer is performed without using a mask.

18. The method according to claim 16, wherein the oxide semiconductor layer is formed by a sputtering method while cooling the substrate.

19. The method according to claim 16, wherein the oxide semiconductor layer is formed by a sputtering method while cooling the substrate so that a temperature of a surface of the substrate is 50° C. or less.

* * * * *